United States Patent
Shiraki

(10) Patent No.: US 9,524,931 B2
(45) Date of Patent: Dec. 20, 2016

(54) WIRING SUBSTRATE, SEMICONDUCTOR PACKAGE, AND METHOD FOR MANUFACTURING SEMICONDUCTOR PACKAGE

(71) Applicant: SHINKO ELECTRIC INDUSTRIES CO., LTD., Nagano-ken (JP)

(72) Inventor: Satoshi Shiraki, Nagano (JP)

(73) Assignee: Shinko Electric Industries Co., Ltd., Nagano-shi, Nagano-ken (JP)

( * ) Notice: Subject to any disclaimer, the term of this patent is extended or adjusted under 35 U.S.C. 154(b) by 15 days.

(21) Appl. No.: 14/592,105

(22) Filed: Jan. 8, 2015

(65) Prior Publication Data

US 2015/0228571 A1 Aug. 13, 2015

(30) Foreign Application Priority Data

Feb. 12, 2014 (JP) .................. 2014-024374

(51) Int. Cl.
*H01L 23/12* (2006.01)
*H01L 23/053* (2006.01)
(Continued)

(52) U.S. Cl.
CPC ... *H01L 23/49838* (2013.01); *H01L 23/49811* (2013.01); *H01L 23/49816* (2013.01); *H01L 23/49822* (2013.01); *H01L 23/49833* (2013.01); *H01L 24/97* (2013.01); *H01L 25/105* (2013.01); *H05K 1/111* (2013.01); *H01L 23/295* (2013.01); *H01L 23/3128* (2013.01); *H01L 23/5389* (2013.01); *H01L 2224/13111* (2013.01); *H01L 2224/13116* (2013.01); *H01L 2224/16237* (2013.01); *H01L 2224/73204* (2013.01); *H01L 2224/81191* (2013.01); *H01L 2224/81801* (2013.01); *H01L 2224/92125* (2013.01);

(Continued)

(58) Field of Classification Search
CPC ........................................................ H01L 21/78
USPC ......................................... 257/710; 438/488
See application file for complete search history.

(56) References Cited

U.S. PATENT DOCUMENTS 7,696,442 B2 * 4/2010 Muramatsu .......... H05K 1/0231
174/260
7,786,569 B2 * 8/2010 Nakagawa .......... H01L 21/4871
174/262

(Continued)

FOREIGN PATENT DOCUMENTS

JP      2002350466 A  * 12/2002
JP      2002373924 A  * 12/2002
WO      WO 2007/069606    6/2007

*Primary Examiner* — Matthew Landau
*Assistant Examiner* — Igwe U Anya
(74) *Attorney, Agent, or Firm* — Fish & Richardson P.C.

(57) ABSTRACT

A wiring substrate includes a block with substrates laid out in an array. The block includes corners and a plan view center. Each substrate includes a substrate body. Pads are formed on the substrate body. Each pad includes a pad surface. The pads of the substrates include first pads, which are the pads of one of the substrates located in at least one of the corners of the block. The pad surface of each of the first pads includes a first axis extending from the first pad toward the plan view center of the block. The pad surface of each of the first pads has a first length along the corresponding first axis and a second length along a second axis, which is orthogonal to the first axis. The first length is longer than the second length.

19 Claims, 16 Drawing Sheets

(51) Int. Cl.
- *H01L 21/20* (2006.01)
- *H01L 21/36* (2006.01)
- *H01L 23/498* (2006.01)
- *H05K 1/11* (2006.01)
- *H01L 25/10* (2006.01)
- *H01L 23/00* (2006.01)
- H01L 23/538 (2006.01)
- H01L 23/31 (2006.01)
- H05K 1/14 (2006.01)
- H05K 3/00 (2006.01)
- H01L 23/29 (2006.01)

(52) U.S. Cl.
CPC .. *H01L 2224/97* (2013.01); *H01L 2225/1023* (2013.01); *H01L 2225/1058* (2013.01); *H01L 2924/12044* (2013.01); *H01L 2924/1431* (2013.01); *H01L 2924/1432* (2013.01); *H01L 2924/1434* (2013.01); *H01L 2924/1436* (2013.01); *H01L 2924/1437* (2013.01); *H01L 2924/1438* (2013.01); *H01L 2924/1533* (2013.01); *H01L 2924/181* (2013.01); *H05K 1/144* (2013.01); *H05K 3/0052* (2013.01); *H05K 3/0097* (2013.01); *H05K 2201/0939* (2013.01); *H05K 2201/09409* (2013.01); *H05K 2201/09418* (2013.01); *H05K 2201/10977* (2013.01)

(56) References Cited

U.S. PATENT DOCUMENTS

| | | | | |
|---|---|---|---|---|
| 8,729,709 | B2* | 5/2014 | Baba | H01L 23/49822 257/686 |
| 2002/0043396 | A1* | 4/2002 | Morimoto | H01L 23/49838 174/250 |
| 2008/0217384 | A1* | 9/2008 | Jayantha | B23K 1/0016 228/180.21 |
| 2009/0008765 | A1* | 1/2009 | Yamano | H01L 21/6835 257/690 |
| 2009/0093111 | A1* | 4/2009 | Buchwalter | H01L 24/11 438/614 |
| 2010/0295174 | A1* | 11/2010 | Ozawa | H01L 23/49838 257/737 |
| 2011/0256662 | A1 | 10/2011 | Yamano et al. | |
| 2011/0316170 | A1* | 12/2011 | Muramatsu | H01L 23/49816 257/774 |
| 2014/0217582 | A1* | 8/2014 | Baba | H01L 23/49822 257/737 |
| 2014/0313681 | A1 | 10/2014 | Yamano et al. | |
| 2015/0334823 | A1* | 11/2015 | Hu | H05K 1/0271 361/783 |

* cited by examiner

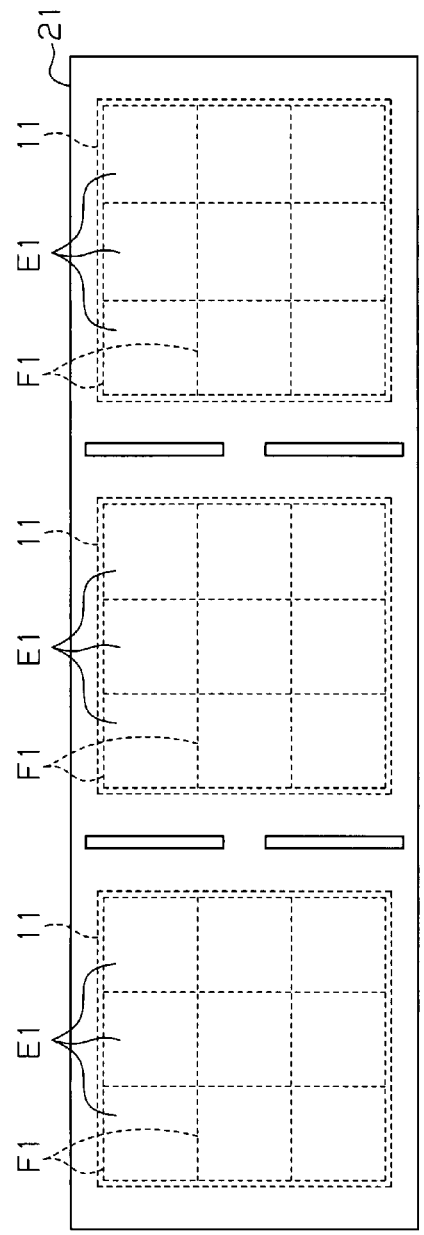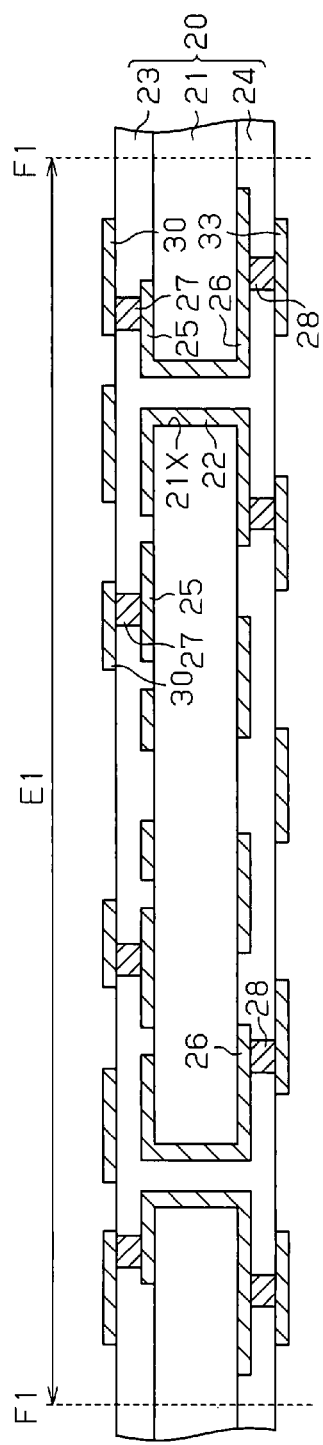
Fig.6A
Fig.6B
Fig.6C

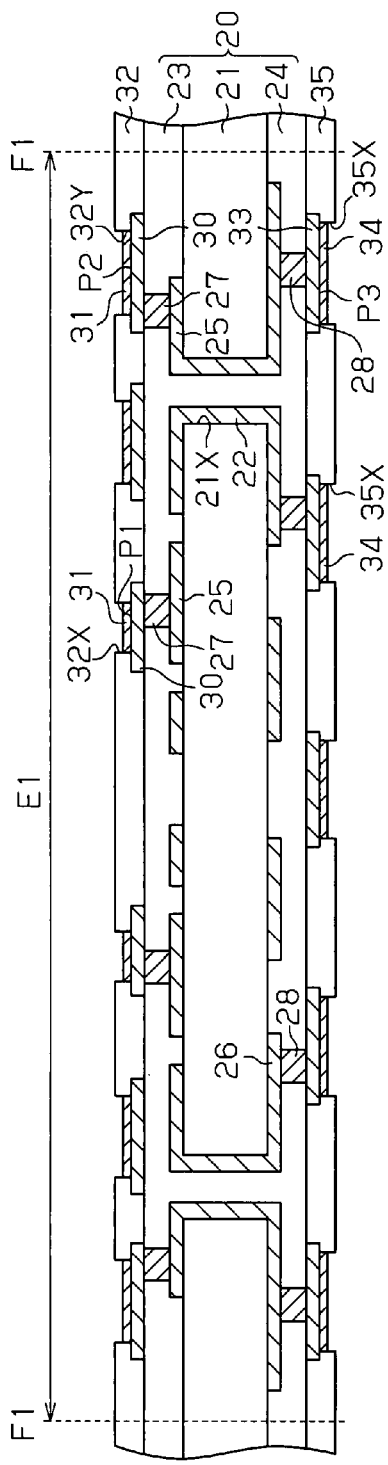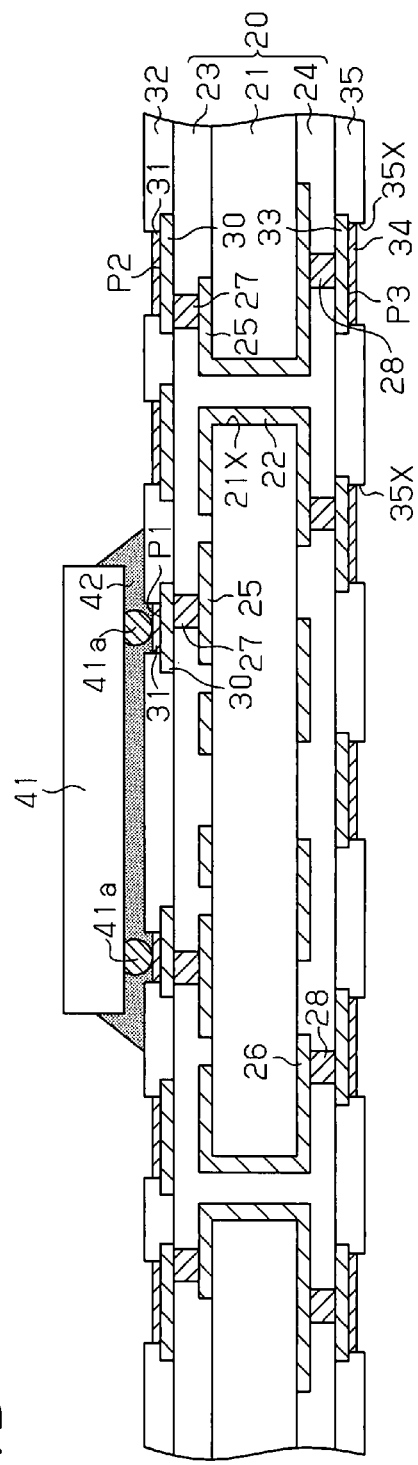

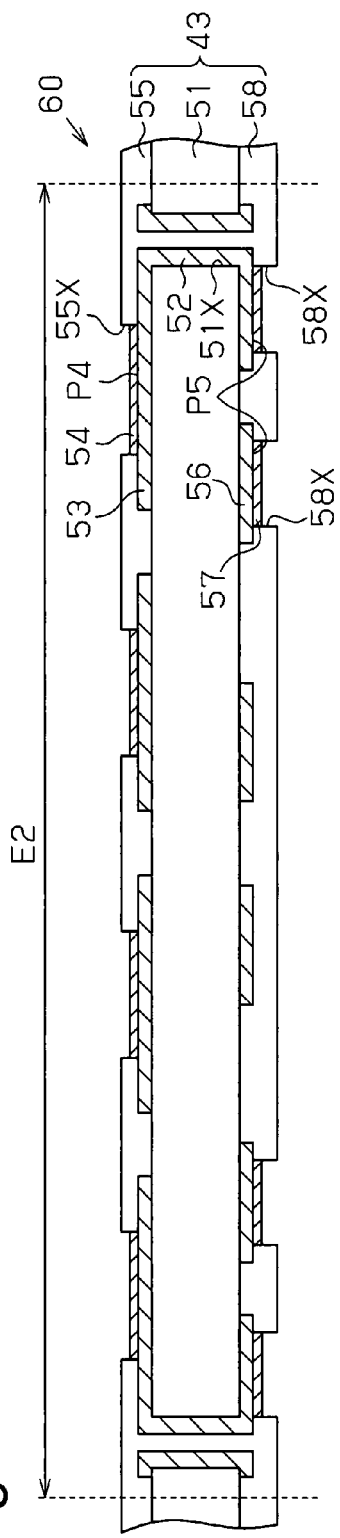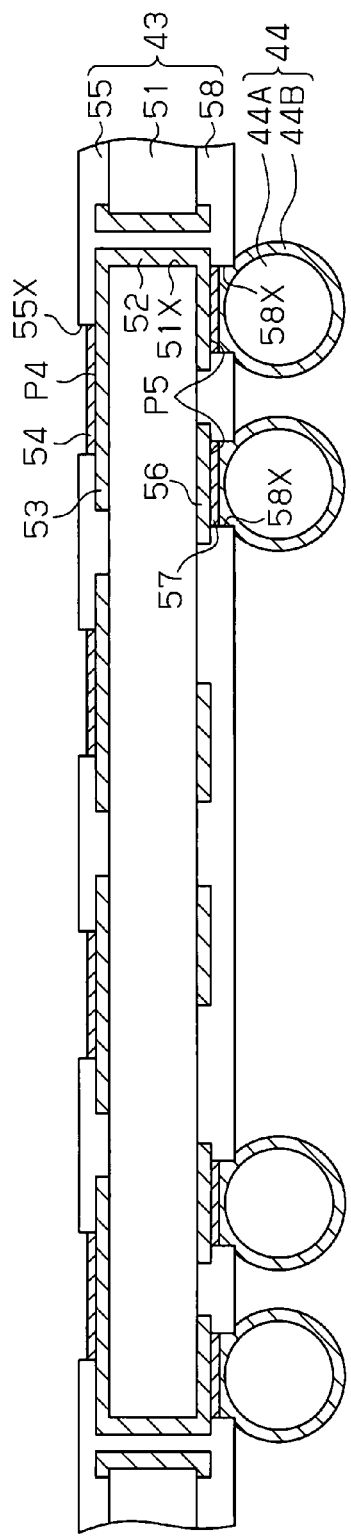

WIRING SUBSTRATE, SEMICONDUCTOR PACKAGE, AND METHOD FOR MANUFACTURING SEMICONDUCTOR PACKAGE

CROSS-REFERENCE TO RELATED APPLICATIONS

This application is based upon and claims the benefit of priority from prior Japanese Patent Application No. 2014-024374, filed on Feb. 12, 2014, the entire contents of which are incorporated herein by reference.

FIELD

The present disclosure relates to a wiring substrate, a semiconductor package, and a method for manufacturing a semiconductor package.

BACKGROUND

International Publication No. WO2007/069606 describes a semiconductor package formed by arranging an electronic component between an upper substrate and a lower substrate and surrounding the electronic component with an encapsulation resin. A known method for manufacturing such a semiconductor package will now be described.

For example, as shown in FIG. 17, a large substrate 72 including a block 71 with a plurality of (7×4 in FIG. 17) lower substrates 70 is first prepared, and an electronic component such as a semiconductor chip, a passive component, or the like is mounted on each lower substrate 70. Then, a large substrate 81 including a plurality of (7×4 in FIG. 17) upper substrates 80 is prepared, and a solder ball is bonded to a connection pad of each upper substrate 80. The solder ball is then bonded to a connection pad of each lower substrate 70, and the large substrate 81 is mounted on the large substrate 72 so that each upper substrate 80 is mounted on the corresponding lower substrate 70 by way of the solder ball. The space between the substrates 72 and the substrates 81 is filled with an encapsulation resin. Dicing is performed to cut and singulate the substrates 72, the substrates 81, and the encapsulation resin. This manufactures semiconductor packages.

SUMMARY

When the large substrate 72 and the large substrate 81 are overlapped, the displacement amount increases at the peripheral portion of the substrates 72 and 81. In particular, if the difference in the diagonal size of the block 71 of the substrate 72 and the diagonal size of the substrate 81 increases due to a manufacturing error or the like, the displacement amount increases between the lower substrate 70 located at a corner of the block 71 and the corresponding upper substrate 80. As a result, the solder ball moves over the edge of an opening in a solder resist layer that exposes the connection pad of the lower substrate 70. This leads to insufficient solderability, which may lower the connection reliability of the lower substrate 70 and the upper substrate 80.

One aspect of a wiring substrate according to one aspect of the present disclosure is a wiring substrate including a block with a plurality of substrates laid out in a predetermined array. The block includes a plurality of corners and a plan view center. Each of the plurality of substrates includes a substrate body and a plurality of pads formed on an upper surface of the substrate body. Each of the pads includes a pad surface. The pads of the substrates include first pads, which are the pads of one of the substrates located in at least one of the corners of the block. The pad surface of each of the first pads includes a first axis extending from the first pad toward the plan view center of the block. The pad surface of each of the first pads has a first length along the corresponding first axis and a second length along a second axis, which is orthogonal to the first axis. The first length is longer than the second length.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 6A is a schematic plan view illustrating a method for manufacturing the wiring substrate, and FIGS. 6B and 6C are schematic cross-sectional views illustrating the method for manufacturing the wiring substrate;

FIG. 7A is a schematic cross-sectional view illustrating the method for manufacturing the wiring substrate, and FIG. 7B is a schematic cross-sectional view illustrating a method for manufacturing the semiconductor package;

FIGS. 9A and 9B are schematic cross-sectional views illustrating the method for manufacturing the semiconductor package;

DESCRIPTION OF THE EMBODIMENTS

In the accompanying drawings, elements are illustrated for simplicity and clarity and have not necessarily been drawn to scale. To facilitate understanding, in the cross-sectional views, some components are shown in screentone and some components are shown without hatching lines.

The structure of a wiring substrate 10 in one embodiment will now be described with reference to FIGS. 1 to 3.

Figure 1A:
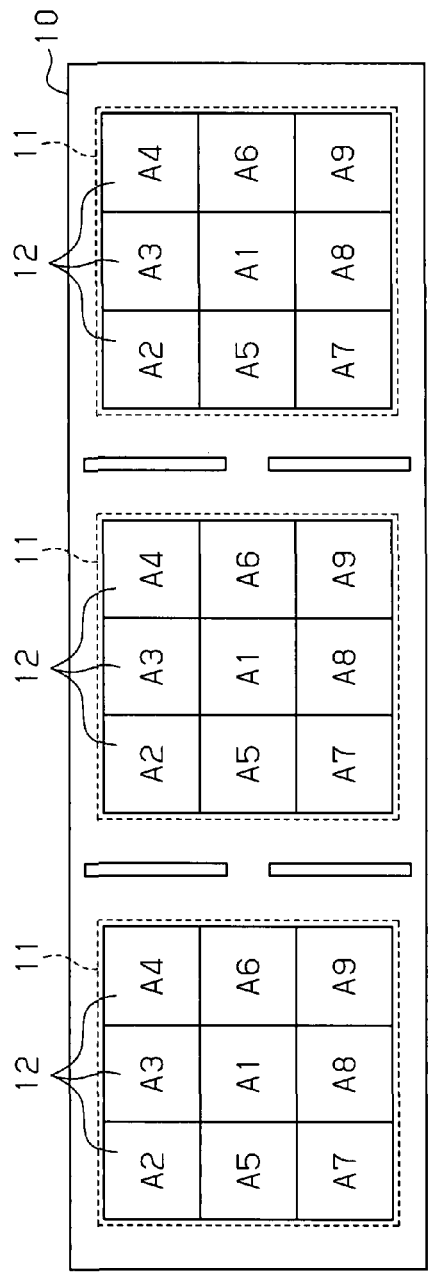
FIG. 1A is a schematic plan view of a wiring substrate in one embodiment.

As shown in FIG. 1A, the wiring substrate 10 has, for example, a substantially tetragonal shape in a plan view. The wiring substrate 10 includes a plurality of (e.g., three) blocks 11 separated from one another. Each block 11 includes a plurality of substrates 12 arranged in a predetermined planar array (e.g., 3×3 matrix array). The substrates 12 undergo a step of mounting electronic components such as semiconductor chips, a step of mounting other substrates that are bonded to a spacer, a step of filling the space between the substrates 12 and the other substrates with an encapsulation resin, and finally cutting out semiconductor packages. In the step of filling the encapsulation resin, for example, resin encapsulation is performed in a batch molding process for each block 11. In the following description, nine substrates 12 arranged in each block 11 may be referred to as substrates A1 to A9, as shown in FIG. 1A. More specifically, in the following description, the substrate A1 refers to the substrate 12 located at the center of each block 11, and the substrates A2 to A9 refer to the substrates 12 located along the periphery of each block 11.

Figure 3:
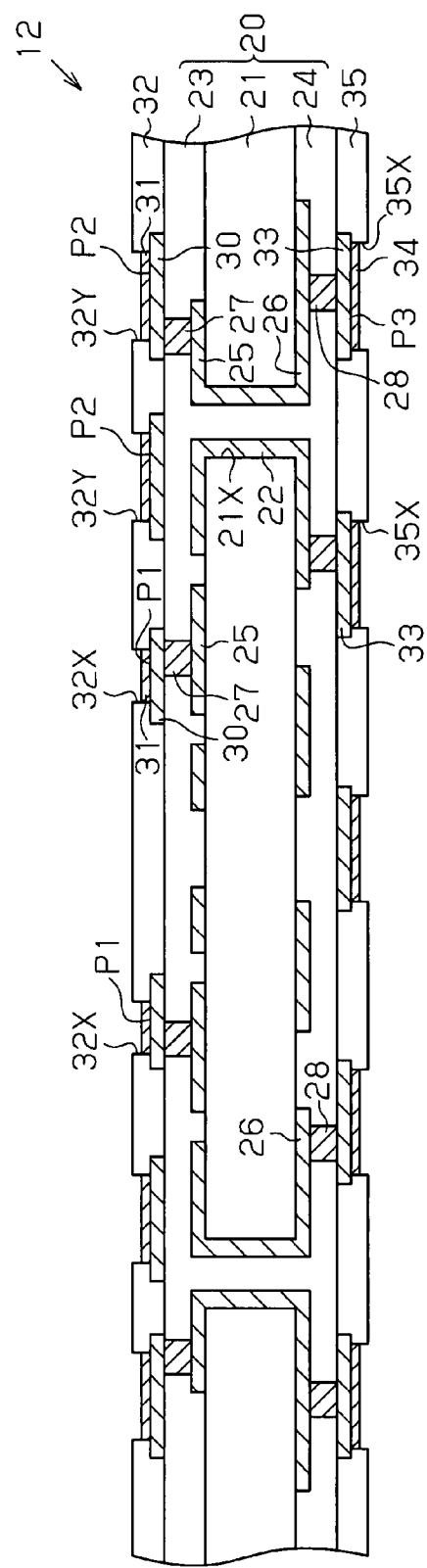
FIG. 3 is a partial cross-sectional view (cross-sectional view taken along line 3-3 in FIG. 1B) of the wiring substrate.

As shown in FIG. 3, each substrate 12 includes a substrate body 20, an uppermost layer wiring pattern 30, a metal layer 31, a solder resist layer 32, a lowermost layer wiring pattern 33, a metal layer 34, and a solder resist layer 35.

The substrate body 20 includes a core substrate 21, through electrodes 22 formed in through holes 21X of the core substrate 21, insulating layers 23 and 24 stacked on the core substrate 21, and wires 25 and 26 and vias 27 and 28 formed in the insulating layers 23 and 24. In the substrate body 20, the through electrodes 22, the wires 25 and 26, and the vias 27 and 28 electrically connect the wiring pattern 30 and the wiring pattern 33. The material of the core substrate 21 may be a glass epoxy resin in which a glass cloth (glass woven fabric) is impregnated with a thermosetting insulative resin, the main component of which is an epoxy resin. The material of the insulating layers 23 and 24 may be, for example, an insulative resin such as an epoxy resin, a polyimide resin, or the like. The material of the through electrodes 22, the wires 25 and 26, and the vias 27 and 28 may be, for example, copper (Cu) or a copper alloy.

The wiring pattern 30 is arranged on an upper surface of the insulating layer 23. In other words, the wiring pattern 30 is arranged on a mounting side surface (e.g., upper surface) of the substrate body 20 where a semiconductor chip 41 (see FIG. 4) is mounted. The material of the wiring pattern 30 may be, for example, copper or a copper alloy. The wiring pattern 30 includes chip pads P1, which are electrically connected to the semiconductor chip 41, and connection pads P2, which electrically connect the substrate 12 to another substrate 43 (see FIG. 4) mounted on the substrate 12. Although not shown from above, each chip pad P1 is arranged in a mounting region R1 (see FIG. 1B) where the semiconductor chip 41 is to mounted in correspondence with the layout of bumps 41a (see FIG. 4), which are arranged on the semiconductor chip 41. For example, the chip pads P1 are arranged in a matrix array in a plan view in the mounting region R1. Each chip pad P1 is, for example circular in a plan view.

The solder resist layer 32 is arranged on the upper surface of the insulating layer 23 to partially cover the wiring pattern 30. The material of the solder resist layer 32 is, for example, an insulative resin such as an epoxy resin or an acrylic resin.

The solder resist layer 32 includes openings 32X, which expose portions of the wiring pattern 30 as the chip pads P1, and openings 32Y, which expose portions of the wiring pattern 30 as the connection pads P2. The metal layer 31 is formed on the wiring pattern 30 exposed from the openings 32X and 32Y, that is, formed on the chip pads P1 and the connection pads P2. One example of the metal layer 31 is a metal layer in which a nickel (Ni) layer and a gold (Au) layer are sequentially stacked from the upper surface of the wiring pattern 30. Other examples of the metal layer 31 is a metal layer in which an Ni layer, a palladium (Pd) layer, and an Au layer are sequentially stacked, a metal layer in which an Ni layer, a Pd layer, and a silver (Ag) layer are sequentially stacked, and a metal layer in which an Ni layer, a Pd layer, an Ag layer, and an Au layer are sequentially stacked from the upper surface of the wiring pattern 30. The Ni layer, the Au layer, the Pd layer, and the Ag layer may each be a metal layer (non-electrolytic plated metal layer) formed by undergoing non-electrolytic plating. The Ni layer is a metal layer containing Ni or an Ni alloy, the Au layer is a metal layer containing Au or an Au alloy, the Pd layer is a metal layer containing Pd or a Pd alloy, and the Ag layer is a metal layer containing Ag or an Ag alloy. For example, if the metal layer 31 is an Ni layer/Au layer, the thickness of the Ni layer may be about 0.05 to 5 μm, and the thickness of the Au layer may be about 0.01 to 1 μm. If a chip pad P1 is covered by the metal layer 31, the metal layer 31 functions as the chip pad P1. If a connection pad P2 is covered by the metal layer 31, the metal layer 31 functions as the connection pad P2.

Figure 1B:
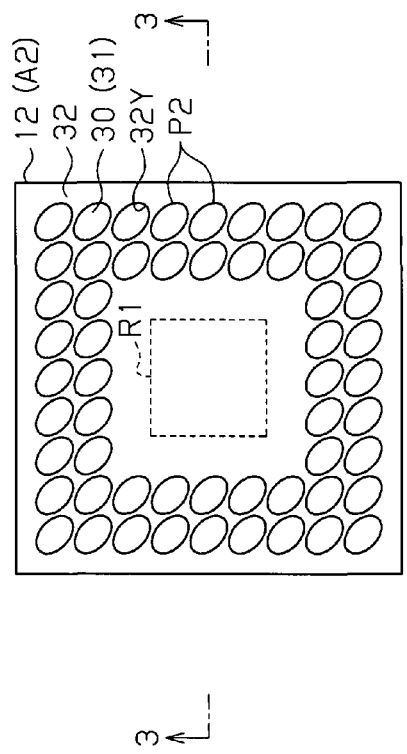
FIG. 1B is an enlarged plan view of a portion of the wiring substrate shown in FIG. 1A.

FIG. 1B is a plan view schematically showing the layout of the connection pads P2 and the openings 32Y in the substrate 12 (e.g., substrate A2). As shown in FIG. 1B, the connection pads P2 and the openings 32Y are arranged in a plurality of rows (e.g., two rows) surrounding the periphery of the mounting region R1.

Figure 2:
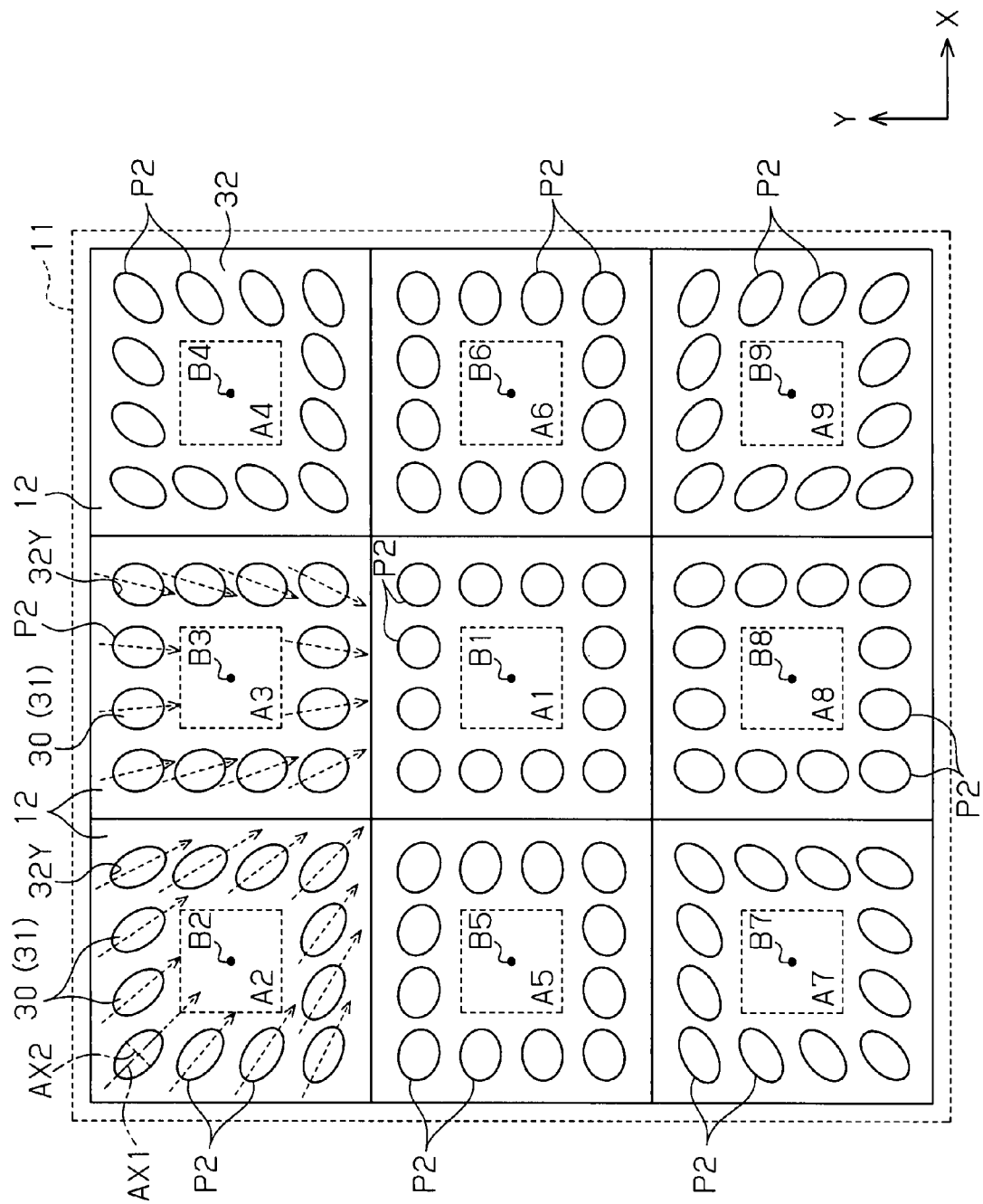
FIG. 2 is a schematic plan view of a block showing the shapes of connection pads in a plan view.

FIG. 2 is a plan view schematically showing the connection pads P2 and the openings 32Y of the substrates A1 to A9 in each block 11. In FIG. 2, the number of the connection pads P2 and the openings 32Y in each substrate A1 to A9 is less than actual to facilitate illustration. In the description hereafter, the connection pad P2 and the opening 32Y have identical plan view shapes in a plan view. Thus, only the plan view shape of the connection pads P2 will be described. The plan view shape of the connection pad P2 is the shape of a pad surface of the pad P2.

As shown in FIG. 2, the connection pads P2 of the substrates A1 to A9 are formed to have plan view shapes that differ in accordance with where the connection pads P2 are located in the block 11. The plan view shape of the connection pads P2 arranged on the substrate A1 in the present example is substantially a true circle. The plan view shape of the connection pads P2 of the substrates A2 to A9 in the present example is a substantially an ellipse. In other words, the connection pads P2 of the substrates A2 to A9 located in the peripheral portion of the block 11 are formed to be substantially ellipse in a plan view, and the connection pads P2 of the substrate A1 located in the central portion of the block 11 are formed to be substantially true circles in a plan view. The plan view shapes of the connection pads P2 of the substrates A2 to A9 will now be described in detail.

Each connection pad P2 (first pad) of the substrates A2 to A9 has the shape of an ellipse and includes a major axis AX1 extending from the connection pad P2 toward a plan view center B1 of the block 11 (see broken line arrow in substrates A2 and A3). Each connection pad P2 of the substrates A2 to A9 has an elliptic plan view shape with a major axis AX1 that becomes longer as the corresponding substrate 12 becomes farther from the plan view center B1 in the block 11. For example, each connection pad P2 that is substantially ellipse in a plan view includes a major axis AX1 that becomes longer as the distance increases from the plan view center of the corresponding substrate 12 to the plan view center B1 of the block 11. Furthermore, each connection pad P2 of the substrates A2 to A9 has an elliptic plan view shape with a minor axis AX2 that becomes shorter as the corresponding substrate 12 becomes farther from the plan view center B1. In other words, each connection pad P2 of the substrates A2 to A9 has a plan view shape with an ellipticity, which is the ratio of the length (major diameter) of the major axis AX1 and the length (minor diameter) of the minor axis AX2, set to be smaller as the corresponding substrate 12 becomes farther from the plan view center B1 in the block 11.

Thus, in the present example, each connection pad P2 of the substrate A2 has a smaller ellipticity than each connection pad P2 of the substrate A3, which is closer to the plan view center B1 of the block 11 than the substrate A2. In the present example, the distance from a plan view center B2 of the substrate A2 to the plan view center B1 of the block 11, the distance from a plan view center B4 of the substrate A4 to the plan view center B1, the distance from a plan view center B7 of the substrate A7 to the plan view center B1, and the distance from a plan view center B9 of the substrate A9 to the plan view center B1 are all the same. Thus, the connection pads P2 of the substrates A2, A4, A7, and A9 are all set to have the same ellipticity. In the present example, the distance from a plan view center B3 of the substrate A3 to the plan view center B1 of the block 11, the distance from a plan view center B5 of the substrate A5 to the plan view center B1, the distance from a plan view center B6 of the substrate A6 to the plan view center B1, and the distance from a plan view center B8 of the substrate A8 to the plan view center B1 are all the same. Thus, each connection pad P2 of the substrates A3, A5, A6, and A8 are all set to have the same ellipticity.

In the present example, the connection pads P2 in the same substrate 12 are all set to have the same ellipticity. In other words, the connection pads P2 of the same substrate 12 are all set to have the same size, that is, the ellipse of each connection pad P2 has the same major diameter and the same minor diameter. Thus, connection pads P2 of the same size are arranged at different angles in accordance with the positional relationship from the plan view center B1 of the block 11 in each substrate.

Furthermore, the upper surfaces of the connection pads P2 of every one of the substrates A1 to A9 in the block 11 are all set to have the same area. In other words, each connection pad P2 of the substrate A1 having the shape of a true circle in a plan view, each connection pad P2 of the substrates A2, A4, A7, and A9 having the shape of an ellipse in a plan view, and each connection pad P2 of the substrates A3, A5, A6, and A8 having the shape of an ellipse in a plan view are all set to have the same area.

In the present example, each connection pad P2 of a substrate 12 (e.g., substrate A2) is formed so that its major axis AX1 lies along a direction (see broken line arrow) extending from the plan view center of the connection pad P2 toward the plan view center B1 of the block 11. In other words, the connection pads P2 of the same substrate 12 are arranged at different angles in accordance with the positional relationship relative to the plan view center B1 of the block 11. However, there is no limit to such a structure. For example, the connection pads P2 of a substrate 12 (e.g., substrate A2) may all be formed so that their major axes AX1 lie along the same direction (e.g., direction from the plan view center of the substrate 12 (e.g., plan view center B2 of the substrate A2) toward the plan view center B1 of the block 11). In other words, the connection pads P2 may be arranged at the same angle in the same substrate 12.

In the present example, the connection pads P2 of the same substrate 12 are all set to have the same major diameter and the same minor diameter. However, there is no limit to such a structure. For example, the connection pads P2 of the same substrate 12 may be set to have different major diameters and different minor diameters in accordance with the positional relationship relative to the plan view center B1 of the block 11. In other words, instead of setting the major diameter and the minor diameter for each of the substrates A2 to A9, a different major diameter and minor diameter may be set for each of the connection pads P2 in the substrates A2 to A9.

As shown in FIG. 3, the wiring pattern 33 is arranged on the lower surface of the insulating layer 24. In other words, the wiring pattern 33 is arranged on a surface (e.g., lower surface) of the substrate body 20 located on the side opposite to the mounting surface. The wiring pattern 33 includes external connection pads P3. An external connection terminal, such as a solder ball or a lead pin, used when mounting the substrate 12 on a mounting substrate, such as a motherboard, is arranged on each external connection pad P3. Although not shown in the drawings, the external connection pads P3 are arranged in, for example, a matrix array. Each external connection pad P3 has, for example, a circular plan view shape.

The solder resist layer 35 is arranged on the lower surface of the insulating layer 24 to cover portions of the wiring pattern 33. The material of the solder resist layer 35 may be, for example, an insulative resin such as an epoxy resin or an acrylic resin. The solder resist layer 35 includes a plurality of openings 35X exposing portions of the wiring pattern 33 as the external connection pads P3. The metal layer 34 is formed on portions of the wiring pattern 33 exposed from the openings 35X, that is, the external connection pads P3. One example of the metal layer 34 is a metal layer in which an Ni layer and an Au layer are sequentially stacked from the lower surface of the wiring pattern 33. Other examples of the metal layer 34 include a metal layer in which an Ni layer, a Pd layer, and an Au layer are sequentially stacked, a metal layer in which an Ni layer, a Pd layer, an Ag layer are sequentially stacked, and a metal layer in which an Ni layer, a Pd layer, an Ag layer, an Au layer are sequentially stacked from the lower surface of the wiring pattern 33. For example, if the metal layer 34 is an Ni layer/Au layer, the thickness of the Ni layer may be about 0.05 to 5 μm, and the thickness of the Au layer may be about 0.01 to 1 μm. If an external connection pad P3 is covered by the metal layer 34, the metal layer 34 functions as an external connection pad.

An organic solderability preservative (OSP) process may be performed on the wiring pattern 33 exposed from the openings 35X to form an OSP film in place of the metal layer 34, and the external connection terminals may be connected to the OSP film. The wiring pattern 33 (when the metal layer 34 or the OSP film is formed on the wiring pattern 33, the metal layer 34 or the OSP film) exposed from each opening 35X may function as the external connection terminal.

The structure of the semiconductor package 40 (electronic component incorporated substrate) will now be described with reference to FIGS. 4 and 5. The substrate 12 of the semiconductor package 40 is the substrate A2 shown in FIG. 1A.

Figure 4:
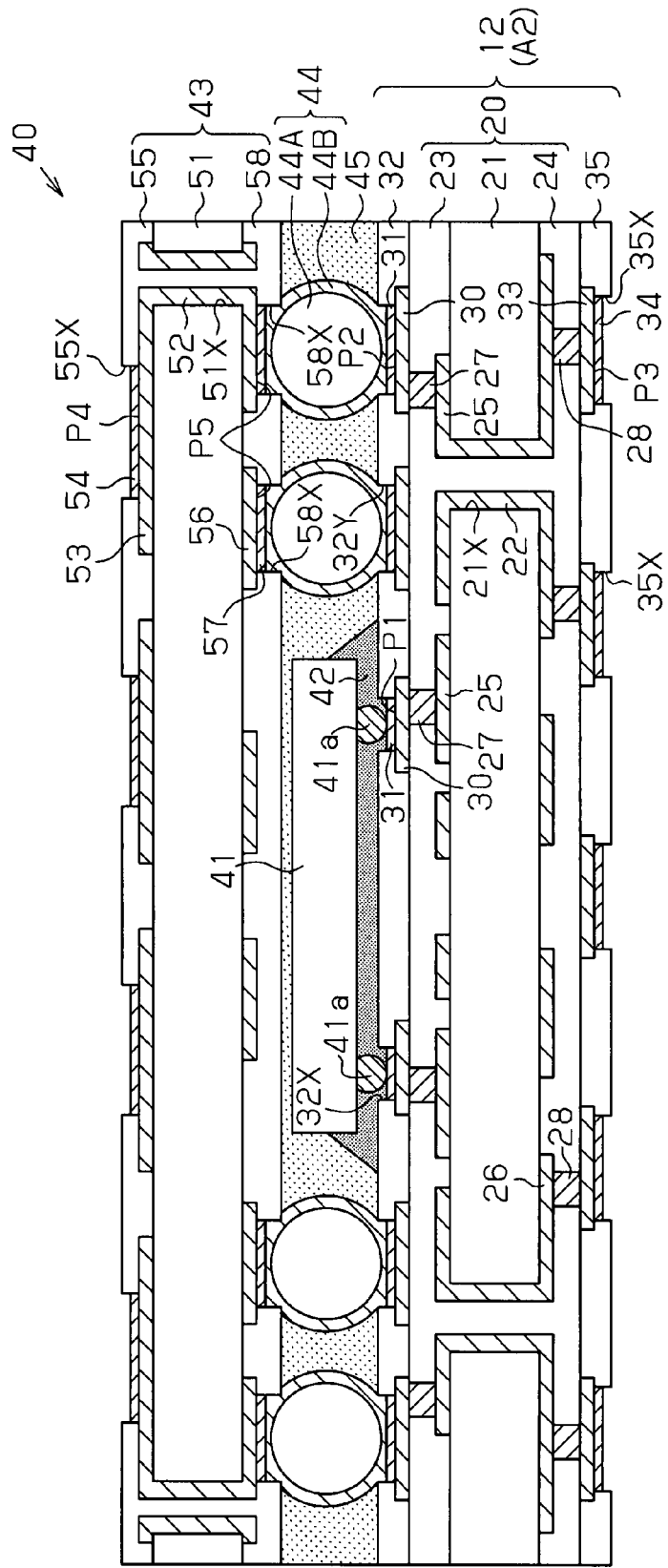
FIG. 4 is a schematic cross-sectional view of a semiconductor package.

As shown in FIG. 4, the semiconductor package 40 includes the substrate 12 (substrate A2), a semiconductor chip 41, an underfill resin 42, a substrate 43, a solder ball 44, and an encapsulation resin 45.

The semiconductor chip 41 is flip-chip mounted on the substrate 12. In other words, the semiconductor chip 41 is faced down when bonded to the substrate 12 by joining the bumps 41a arranged on a circuit forming surface (e.g., lower surface) of the semiconductor chip 41 with the metal layer 31 formed on the corresponding chip pads P1. The semiconductor chip 41 is electrically connected to the chip pad P1 by the bumps 41a and the metal layer 31.

A logic chip, such as a central processing unit (CPU) chip or a graphics processing unit (GPU) chip, may be used as the semiconductor chip 41. Further, a memory chip such as a dynamic random access memory (DRAM) chip, a static random access memory (SRAM) chip, or a flash memory chip, may also be used as the semiconductor chip 41. The size of the semiconductor chip 41 is, for example, about 3 mm×3 mm to 12 mm×12 mm in a plan view. The thickness of the semiconductor chip 41 is, for example, about 50 to 100 μm.

The bumps 41a may be, for example, gold bumps or solder bumps. The material of a solder bump may be, for example, an alloy containing lead (Pb), an alloy of tin (Sn) and Au, an alloy of Sn and Cu, an alloy of Sn and Ag, or an alloy of Sn, Ag, and Cu. The height of each bump 41a is, for example, about 20 to 70 μm.

The semiconductor chip 41 is mounted on the substrate 12. However, there is no limit to such a structure, and other electronic components (e.g., capacitor or inductor) may be mounted on the substrate 12.

The gap between the upper surface of the substrate 12 and the lower surface of the semiconductor chip 41 is filled with the underfill resin 42. An insulative resin such as an epoxy resin may be used as the material of the underfill resin 42.

The structure of the substrate 43 will now be described.

The substrate 43 includes through electrodes 52 formed in through holes 51X of a core substrate 51, an uppermost layer wiring pattern 53, a metal layer 54, a solder resist layer 55, a lowermost layer wiring pattern 56, a metal layer 57, and a solder resist layer 58. The through electrodes 52 electrically connect the wiring pattern 53 and the wiring pattern 56. An insulative resin such as a glass epoxy resin may be used as the material of the core substrate 51.

The wiring pattern 53 is arranged on an upper surface of the core substrate 51. The material of the wiring pattern 53 may be, for example, copper or a copper alloy. The wiring pattern 53 includes component connection pads P4 electrically connected to an electronic component (e.g., semiconductor chip or passive component) that differs from the semiconductor chip 41 and the semiconductor package. Each component connection pad P4 has, for example, a circular plan view shape.

The solder resist layer 55 is stacked on the upper surface of the core substrate 51 to cover portions of the wiring pattern 53. The material of the solder resist layer 55 may be, for example, an insulative resin such as an epoxy resin or an acrylic resin. The solder resist layer 55 includes openings 55X exposing portions of the wiring pattern 53 as the component connection pads P4. The metal layer 54 is formed on portions of the wiring pattern 53 exposed from the openings 55X, that is, the component connection pads P4. One example of the metal layer 54 is a metal layer in which the Ni layer/Au layer are sequentially stacked from the upper surface of the wiring pattern 53. Other examples of the metal layer 54 include a metal layer in which an Ni layer, a Pd layer, an Au layer are sequentially stacked, a metal layer in which an Ni layer, a Pd layer, an Ag layer are sequentially stacked, and a metal layer in which an Ni layer, a Pd layer, an Ag layer, and an Au layer are sequentially stacked from the upper surface of the wiring pattern 53. For example, if the metal layer 54 is an Ni layer/Au layer, the thickness of the Ni layer is about 0.05 to 5 μm, and the thickness of the Au layer is about 0.01 to 1 μm. If the component connection pad P4 is covered by the metal layer 54, the metal layer 54 functions as the component connection pad.

The wiring pattern 56 is arranged on the lower surface of the core substrate 51. The wiring pattern 56 includes connection pads P5 electrically connecting the substrate 12 and the substrate 43.

The solder resist layer 58 is stacked on the lower surface of the core substrate 51 to cover portions of the wiring pattern 56. An insulative resin such as an epoxy resin and an acrylic resin may be used as the material of the solder resist layer 58. The solder resist layer 58 includes openings 58X exposing portions of the wiring pattern 56 as the connection pads P5. The metal layer 57 is formed on portions of the wiring pattern 56 exposed from the openings 58X, that is, the connection pads P5. One example of the metal layer 57 includes a metal layer in which an Ni layer and an Au layer are sequentially stacked from the lower surface of the wiring pattern 56. Other examples of the metal layer 57 includes a metal layer in which an Ni layer, a Pd layer, an Au layer are sequentially stacked, a metal layer in which an Ni layer, a Pd layer, an Ag layer are sequentially stacked, and a metal layer in which an Ni layer, a Pd layer, an Ag layer, and an Au layer are sequentially stacked from the lower surface of the wiring pattern 56. For example, if the metal layer 57 is an Ni layer/Au layer, the thickness of the Ni layer is about 0.05 to 5 μm, and the thickness of the Au layer is about 0.01 to 1 μm. If each connection pad P5 is covered by the metal layer 57, the metal layer 57 functions as the connection pad.

Figure 5:
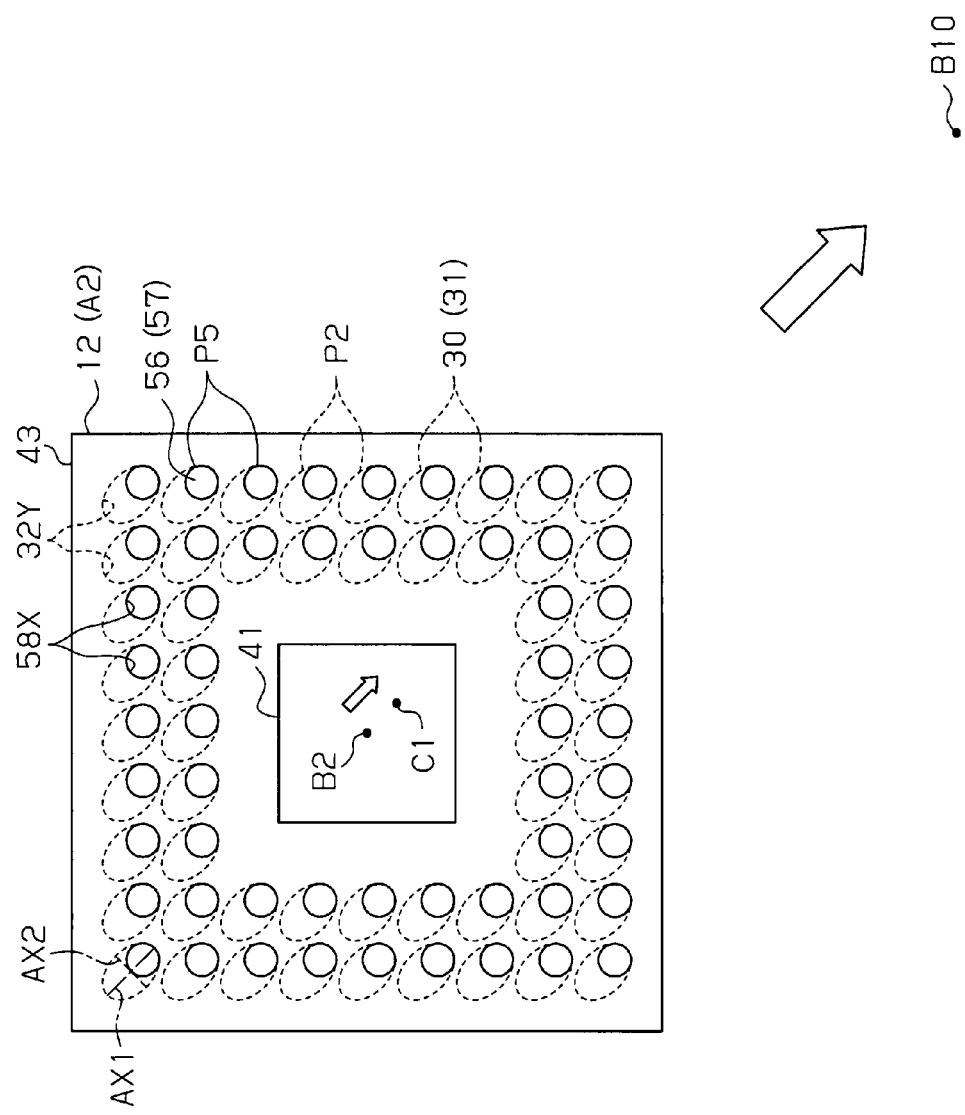
FIG. 5 is a schematic plan view of the semiconductor package.

FIG. 5 is a plan view schematically showing the positional relationship of the connection pads P2 (openings 32Y) and the connection pads P5 (openings 58X).

As shown in FIG. 5, the connection pad P5 is arranged to face each connection pad P2 of the substrate 12 and have a plan view shape that is substantially an ellipse. More specifically, the connection pads P5 of the present example are arranged in a plurality of rows (e.g., two rows) surrounding the periphery of the semiconductor chip 41 in a plan view. Each connection pad P5 has, for example, a circular plan view shape. The elliptical plan view shape of each connection pad P2 has a major axis AX1 lying along a direction extending from the connection pad P2 toward an arbitrary point B10. The arbitrary point B10 is, for example, a point located at a position corresponding to the plan view center B1 of the block 11 shown in FIG. 2. Further, the arbitrary point B10 is a point located on the same plane as the connection pad P2 at the outer side of the semiconductor package 40. Each connection pad P5 is arranged so that the entire lower surface overlaps with a portion of the upper surface of the opposing connection pad P2 in a plan view.

For example, in the present example, the plan view center C1 of the substrate 43 is displaced from the plan view center B2 of the substrate 12 (substrate A2) in the direction of the arrow in the drawing. In other words, the substrate 43 is mounted on the substrate A2 with the plan view center C1 displaced from the plan view center B2 of the substrate A2 in a direction extending toward the arbitrary point B10. Thus, the connection pads P5 of the substrate 43 are also displaced from the plan view center of the opposing connection pad P2 in the direction extending toward the arbitrary point B10. In this case, the major axis of each connection pad P2 lies along displacement direction of the opposing connection pad P5. Thus, even if displacement occurs between the plan view center B2 of the substrate A2 and the plan view center C1 of the substrate 43, the entire lower surface of each connection pad P5 faces the upper surface of the corresponding connection pad P2.

As shown in FIG. 4, each solder ball 44 is joined with each connection pad P5 (metal layer 57). Each solder ball 44 is also joined with the connection pad P2 (metal layer 31) of the substrate 12. More specifically, the solder ball 44 is arranged between the substrate 12 and the substrate 43. One end of the solder ball 44 is joined with the metal layer 57, and the other end of the solder ball 44 is joined with the metal layer 31. The solder ball 44 functions as a connection terminal electrically connecting the connection pad P2 and the connection pad P5. The solder ball 44 also functions as a spacer for holding the distance (spaced distance) between the substrate 12 and the substrate 43 at a specified value.

The solder ball 44 of the present example has a structure in which a spherical copper core ball 44A is covered with solder 44B. In the solder ball 44, the solder 44B functions as a joining material. Thus, the solder 44B joins the solder ball 44 with the connection pad P2 and the connection pad P5. In the solder ball 44, the copper core ball 44A functions as a spacer. Thus, the height (diameter) of the copper core ball 44A sets the height of the space between the substrate 12 and the substrate 43 in addition to the pitch of the solder balls 44. The height of the copper core ball 44A is set to be, for example, greater than the thickness of the semiconductor chip 41. Specifically, the height of the copper core ball 44A is set to be greater than the total thickness of the semiconductor chip 41 and the bump 41a. For example, the height of the copper core ball 44A may be about 100 to 200 µm. The pitch of the solder ball 44 may be, for example, about 200 to 400 µm.

The space between the substrate 12 and the substrate 43 is filled with the encapsulation resin 45. The encapsulation resin 45 fixes the substrate 43 to the substrate 12, and encapsulates the semiconductor chip 41 mounted on the substrate 12. In other words, the encapsulation resin 45 functions as an adhesive that adheres the substrate 12 and the substrate 43. The encapsulation resin 45 also functions as a protective layer for protecting the semiconductor chip 41. Further, the encapsulation resin 45 increases the mechanical strength of the entire semiconductor package 40.

The material of the encapsulation resin 45 may be, for example, an insulative resin such as an epoxy resin or a polyimide resin. The material of the encapsulation resin 45 may also be a resin material in which a filler, such as silica (SiO2), is mixed with an epoxy resin or a polyimide resin. Instead of silica, that material of the filler may be an inorganic compound such as a titanium oxide, aluminum oxide, aluminum nitride, silicon carbide, calcium titanate, zeolite, and the like, or an organic compound. The encapsulation resin 45, for example, may be a mold resin formed through transfer molding, compression molding, injection molding, and the like.

A method for manufacturing the wiring substrate 10 will now be described.

First, as shown in FIGS. 6A and 6B, the core substrate 21 is prepared to manufacture the wiring substrate 10. The core substrate 21 is, for example, a flat plate having a tetragonal shape in a plan view. A large substrate, from which a large number of substrates 12 are obtained, is used as the core substrate 21. In detail, the core substrate 21 includes a plurality of (e.g., three) separate blocks 11, as schematically shown in FIG. 6A. Each block 11 includes a predetermined array (e.g., 3×3 matrix array) of substrate formation regions E1, each of which is where a substrate 12 is formed. The large core substrate 21 is cut by a dicing blade or the like along a cutting line F1 in a subsequent step after manufacturing the semiconductor package 40. In FIGS. 6C to 7B, which will be described below, the structure of only one substrate formation region E1 is shown for the sake of brevity.

In the step shown in FIG. 6C, the through holes 21X are formed at certain locations of the core substrate 21. The wall surfaces of the through holes 21X are plated to form the through electrodes 22 and electrically connect the two surfaces of the core substrate 21. Then, for example, a subtractive process is performed to form the wires 25 and 26. Next, the insulating layers 23 and 24 are respectively formed on the upper surface and the lower surface of the core substrate 21 by vacuum laminating, heating, and hardening a resin film. The insulating layers 23 and 24 may be formed by applying and heating a paste or liquid of a resin. An opening is then formed in each of the insulating layers 23 and 24. When necessary, desmearing is performed. Then, for example, a semi-additive is performed to form the vias 27 and 28 and the wiring patterns 30 and 33.

In the step shown in FIG. 7A, the solder resist layer 32 including the openings 32X for exposing portions of the wiring pattern 30 as the chip pads P1 and the openings 32Y for exposing portions of the wiring pattern 30 as the connection pads P2. The solder resist layer 35 includes the openings 35X exposing portions of the wiring pattern 33 as the external connection pads P3. In the present step, the openings 32Y and the connection pads P2 are laid out and shaped as shown in the plan view of FIG. 1B. Thus, the connection pads P2 shaped to be substantially ellipse in a plan view are formed in the substrate formation region E1, which is located in the peripheral portion of the block 11.

Then, for example, the metal layer 31 is formed on the chip pads P1 and the connection pads P2 by performing a non-electrolytic plating method, and the metal layer 34 is formed on the external connection pads P3. The above manufacturing steps allow the structure corresponding to the substrate 12 to be manufactured in each substrate formation region E1, and the wiring substrate 10 including a large number of substrates 12 to be manufactured.

A method for manufacturing the semiconductor package 40 will now be described.

First, in the step shown in FIG. 7B, the bumps 41a of the semiconductor chip 41 are flip-chip bonded to the metal layer 31 formed on the chip pads P1. In other words, the semiconductor chip 41 is flip-chip mounted in each substrate formation region E1 of the wiring substrate 10. Then, the space between the semiconductor chip 41 and the solder resist layer 32 is filled with the underfill resin 42.

Figure 8:
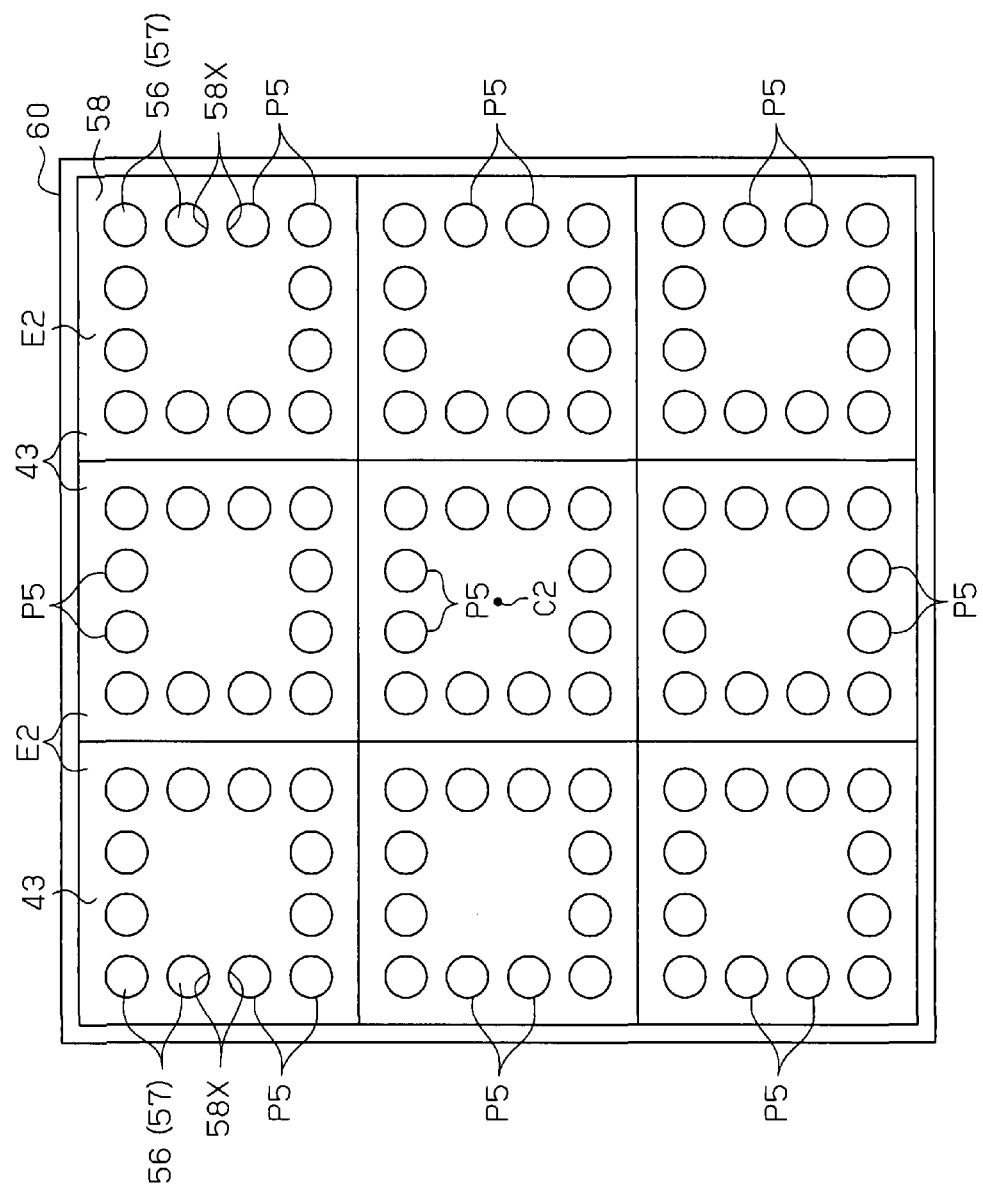
FIG. 8 is a schematic plan view illustrating the method for manufacturing the semiconductor package.
Figure 11:
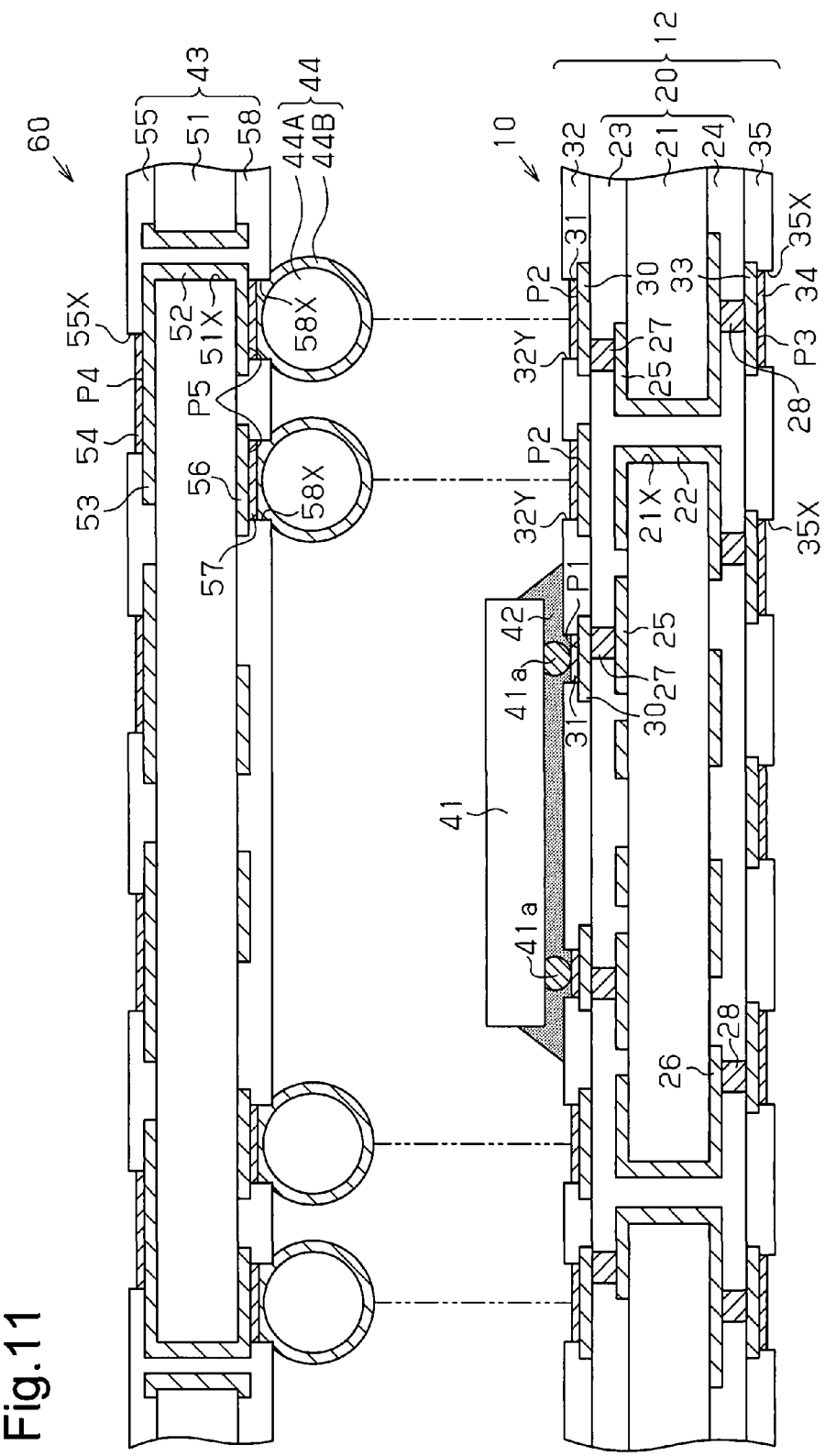
FIG. 11 is a schematic cross-sectional view illustrating the method for manufacturing the semiconductor package.

As shown in FIGS. 8 and 9A, a substrate material 60 for forming the substrate 43 is prepared. The substrate material 60, which is a single sheet of a substrate material used to form a plurality of substrates 43, includes a plurality of substrate formation regions E2, which are where the substrates 43 are formed. In the substrate material 60 of the present example, the substrate formation regions E2 are laid out in a predetermined planar array (e.g., 3×3 matrix) and, for example, in the same array as the substrate formation regions E1 (substrates 12) of the wiring substrate 10. FIG. 8 shows when a structure corresponding to the substrate 43 is formed in each substrate formation region E2, that is, when a large number of connection pads P5 and the metal layer 57 are formed on the lower side of each substrate formation region E2. The substrate material 60 is cut with a dicing blade or the like into the substrates 43 in a subsequent step. This singulates structures corresponding to the substrates 43. The structure corresponding to the substrate 43 can be manufactured through a known manufacturing method, which will briefly be described with reference to FIGS. 8 and 9A. FIGS. 9, 11, and 13 shown the cross-sectional structure of the substrate material 60 in only one substrate formation region E2 for the sake of brevity.

First, as shown in FIG. 9A, the through holes 51X are formed at certain locations in the core substrate 51, and the wall surfaces of the through holes 51X are plated to form the through electrodes 52 that electrically connect the two surfaces of the core substrate 51. Then, for example, a subtractive process is performed to form the wiring patterns 53 and 56. Next, the solder resist layer 55 is formed including the openings 55X exposing portions of the wiring pattern 53 as the component connection pads P4, and the solder resist layer 58 is formed including the openings 58X exposing portions of the wiring pattern 56 as the connection pads P5. In this case, as shown in FIG. 8, the openings 58X and the connection pads P5 are formed along the periphery of each substrate formation region E2 in the same manner as the openings 32Y and the connection pads P2. Each opening 58X and each connection pad P5 has a substantially circular shape in a plan view. Each connection pad P5 is, for example, set to have a smaller diameter then the connection pads P2 of the substrate A1 shaped as a substantially true circle in a plan view. In FIG. 8, the number of connection pads P5 in each substrate formation region E2 is reduced to show, in plan view, the layout and the shape of the connection pads P5 in a simplified manner.

Then, as shown in FIG. 9A, the metal layer 54 is formed on the component connection pads P4, and the metal layer 57 is formed on the connection pads P5 by performing, for example, non-electrolytic plating method. In the above manufacturing steps, the structure corresponding to the substrate 43 can be manufactured in each substrate formation region E2 of the substrate material 60.

In the step shown in FIG. 9B, the solder balls 44 are mounted on (joined with) the metal layer 57. For example, after appropriately applying flux to the metal layer 57, the solder balls 44 are mounted, and a reflow process is performed at a temperature of about 230° C. to 260° C. to fix the solder ball 44 on the metal layer 57. Then, the surface is washed to remove the flux.

Figure 10:
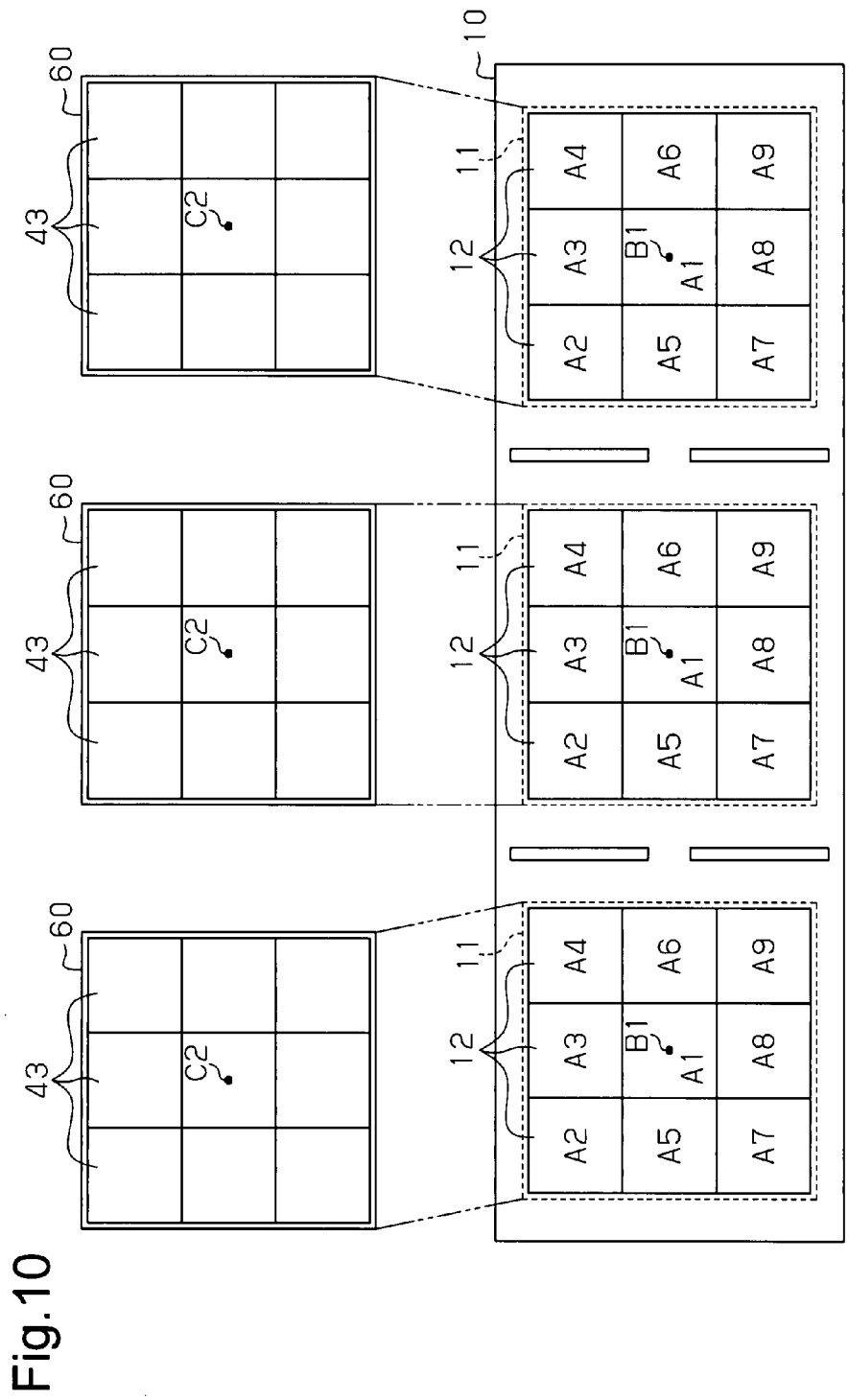
FIG. 10 is a schematic plan view illustrating the method for manufacturing the semiconductor package.

As shown in FIG. 10, three (i.e., same number as the number of blocks 11 arranged in the wiring substrate 10) substrate materials 60, each including a plurality of substrates 43 joined with the solder ball 44, are manufactured in the manufacturing steps described above.

Then, in the step shown in FIG. 10, three substrate materials 60 are respectively stacked on the three blocks 11 of the wiring substrate 10. In other words, the 3×3 substrates 43 arranged on each substrate material 60 are stacked on the 3×3 substrates 12 arranged in each block 11.

Specifically, the substrate materials 60 are first arranged on the blocks 11 so that 3×3 substrates 12 in each block 11 are aligned with the 3×3 substrates 43 in the corresponding substrate material 60 in the vertical direction. More specifically, as shown in FIG. 11, the upper surface of the solder resist layer 32 in each substrate 12 and the lower surface of the solder resist layer 58 of each substrate 43 are faced toward each other, and positioned so that the metal layer 31 (connection pad P2) and the solder ball 44 (connection pad P5) face each other.

Figure 12:
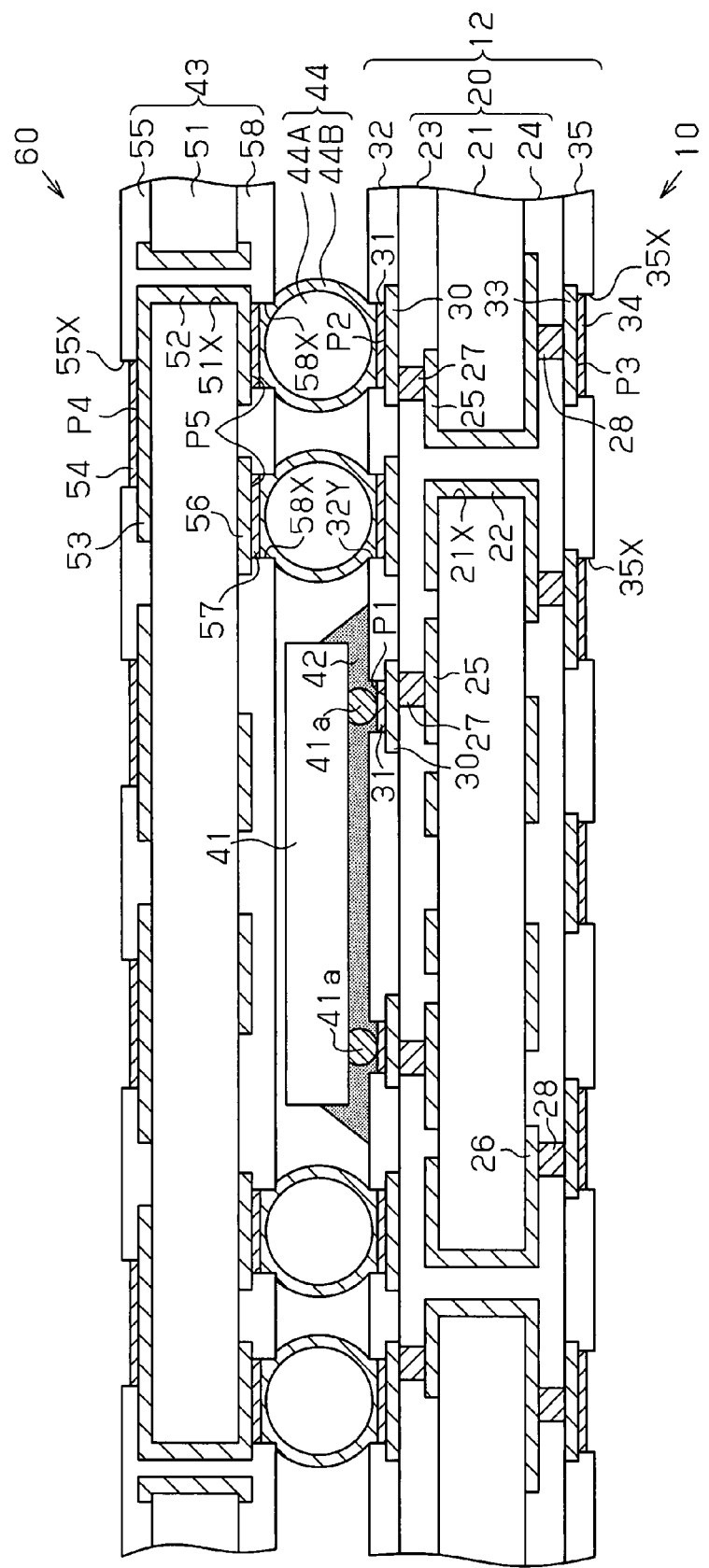
FIG. 12 is a schematic cross-sectional view illustrating the method for manufacturing the semiconductor package.

Then, the solder balls 44 are bonded to the upper surface of the metal layer 31 serving as pads. For example, after appropriately applying flux to the upper surface of the metal layer 31, the substrate material 60 is arranged on the block 11 (substrate 12) of the wiring substrate 10 with the solder balls 44 located in between, as shown in FIG. 12. A gap (space) is formed by the solder balls 44 between the solder resist layer 32 of each substrate 12 and the solder resist layer 58 of each substrate 43. The wiring substrate 10 and the substrate material 60, which are overlapped as described above, are then heated at a temperature of about 230° C. to 260° C. in a reflow furnace. This melts the solder 44B of each solder ball 44 and joins the solder ball 44 with the metal layer 31. Accordingly, the substrate material 60 is fixed to the wiring substrate 10 by the solder balls 44, which electrically connect the connection pads P2 and the connection pads P5. Although the reflow process is performed by pushing the substrate material 60 against the wiring substrate 10 in the present step, the interval between the substrate material 60 and the wiring substrate 10 is maintained at a predetermined distance since the copper core ball 44A of the solder ball 44 functions as the spacer.

With reference to FIG. 13, the positional relationship of the connection pads P2 and P5 will now be described for a situation when the difference in the diagonal size of the plan view shape of the block 11 and the diagonal size of the plan view shape of the substrate material 60 are large in the steps shown in FIGS. 10 to 12.

Figure 13B:
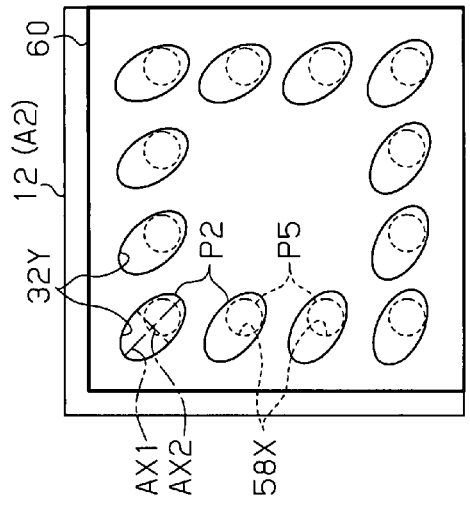
FIGS. 13A to 13D are schematic plan views illustrating the method for manufacturing the semiconductor package.
Figure 13D:
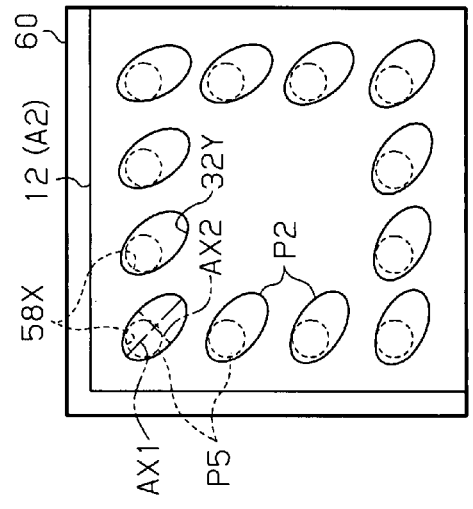
Figure 13A:
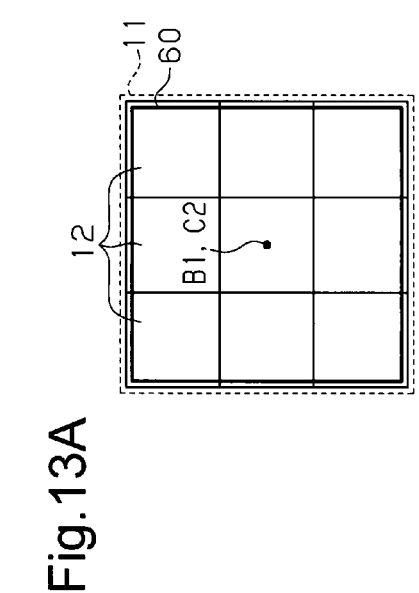

First, in the step shown in FIG. 10, the substrate material 60 is stacked on the block 11 so that the plan view center C2 of the substrate material 60 coincides with the plan view center B1 of the block 11. As shown in FIG. 13A, if the diagonal size of the plan view shape of the substrate material 60 is smaller than the diagonal size of the plan view shape of the block 11, displacement occurs in the direction from the corner of the block 11 toward the plan view center B1 of the block 11. Thus, the connection pads P5 of the substrate material 60 is arranged on the connection pad P2 displaced in the direction from the plan view center of the corresponding connection pad P2 toward the plan view center B1 of the block 11. In this case, the connection pads P2 arranged on the substrates A2 to A9 positioned at the peripheral portion of the block 11, where the displacement amount is large, are formed to have a plan view shape that is an ellipse with a major axis AX1 lying in the direction extending from the plan view center of the connection pad P2 toward the plan view center B1 of the block 11. Thus, as shown in FIG. 13B, the entire lower surface of the connection pad P5 may face a portion of the upper surface of the corresponding connection pad P2 even in the substrate A2 located at the corner of the block 11 where the displacement amount is the largest.

Figure 13C:
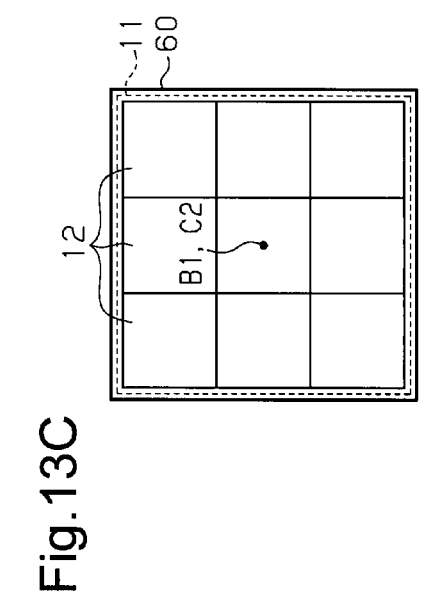

As shown in FIG. 13C, if the diagonal size of the plan view shape of the substrate material 60 is greater than the diagonal size of the plan view shape of the block 11, displacement occurs in the direction from the plan view center B1 of the block 11 toward the corner of the block 11 (corner of the substrate material 60). Thus, the connection pads P5 are arranged on the connection pads P2 displaced in a direction opposite to the direction from the plan view center of the corresponding connection pad P2 toward the plan view center B1 of the block 11. In this case, the plan view shapes of the connection pads P2 arranged on the substrates A2 to A9 are formed to be an ellipse having a major axis AX1 lying in the direction extending from the plan view center of the connection pad P2 toward the plan view center B1 of the block 11. Thus, as shown in FIG. 13D, the entire lower surface of each connection pad P5 faces a portion of the upper surface of the corresponding connection pad P2 even in the substrate A2 located at the corner of the block 11 where the displacement amount is the largest.

Accordingly, in the step shown in FIG. 12, the connection pads P2 and P5 are aligned to face each other in the vertical direction. Thus, the solder balls 44 are bonded to the connection pads P5 and properly mounted on the opposing connection pad P2. In other words, even if displacement occurs as shown in FIG. 13, the solder balls 44 stop or reduced movement of the edges of the openings 32Y onto the solder resist layer 32 of the substrate 12.

Figure 14:
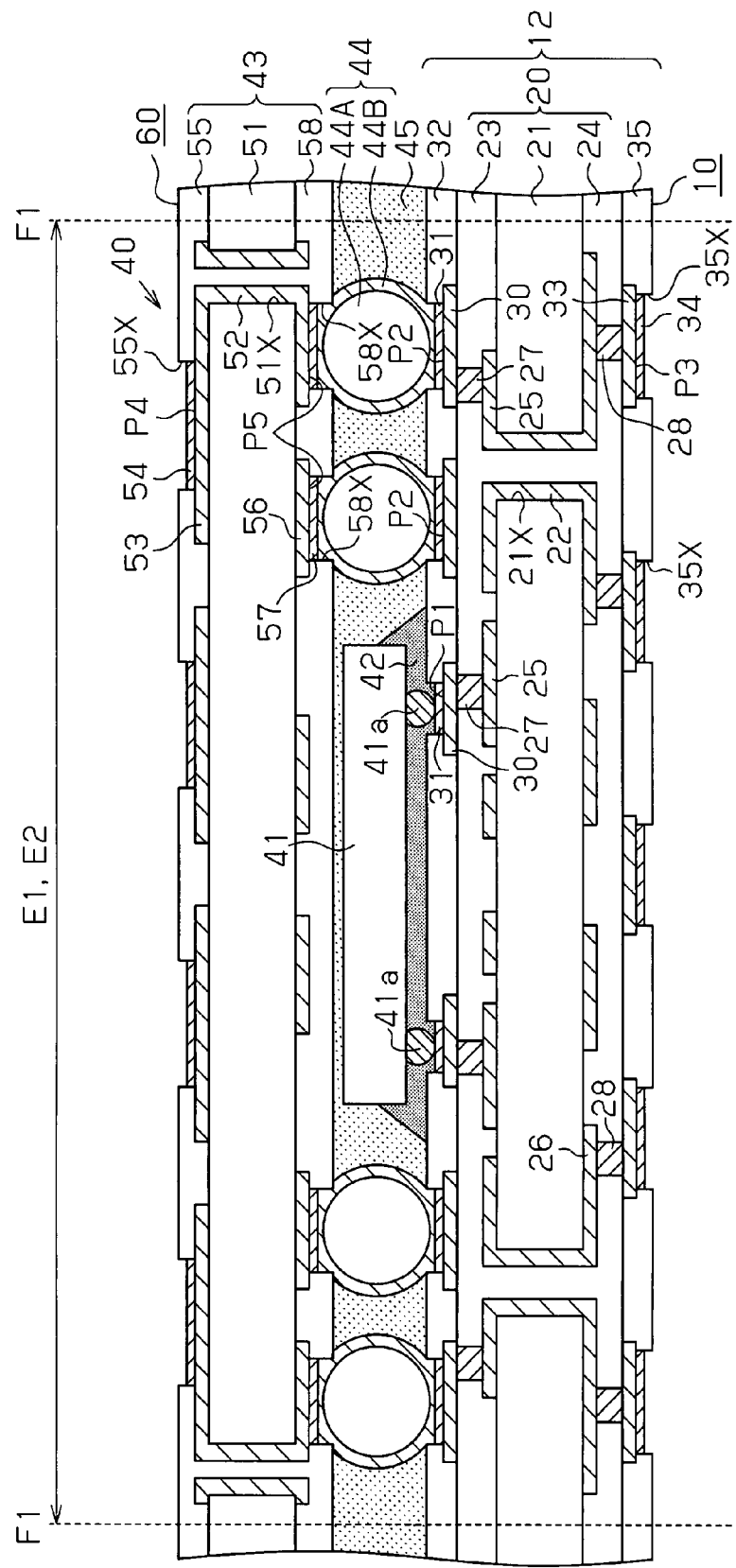
FIG. 14 is a schematic cross-sectional view illustrating the method for manufacturing the semiconductor package.

In the step shown in FIG. 14, the space between the wiring substrate 10 and the substrate material 60, that is, the space between the solder resist layer 32 and the solder resist layer 58 is filled with the encapsulation resin 45. For example, the encapsulation resin 45 is formed in the space between the wiring substrate 10 (substrate 12) and the substrate material 60 (substrate 43) in each block 11 (see FIG. 10) by performing batch molding. The encapsulation resin 45 firmly fixes the wiring substrate 10 and the substrate material 60 and encapsulates the semiconductor chip 41. Although not particularly illustrated, the encapsulating step is carried out by placing the structure shown in FIG. 12 in a lower mold of a molding device (set of upper mold and lower mold), closing the lower mold with the upper mold, and injecting insulative resin into the corresponding block 11 through a mold gate (not shown) while heating and pressurizing the resin. In this case, if a thermosetting molding resin is used as the material of the encapsulation resin 45, pressure (e.g., about 5 to 10 MPa) is applied to the interior of the molding device to drawn in fluid mold resin. Then, the mold resin is heated (heating temperature is, for example, 180° C.) and hardened to form the encapsulation resin 45. Methods such as transfer molding, compression molding, injection molding, and the like may be performed to inject the molding resin.

The above manufacturing steps manufactures the structure corresponding to the semiconductor package 40 in each substrate formation region E1 of the wiring substrate 10 and each substrate formation region E2 of the substrate material 60.

The structure shown in FIG. 14 is cut with a dicing blade or the like along the cutting line F1 of the block 11 to singulate a large number of semiconductor packages 40. The above manufacturing steps batch-manufactures a large number of semiconductor packages 40. The number of semiconductor packages 40 that are batch-manufactured is not particularly limited, and any number of semiconductor packages 40 can be batch-manufactured within a range the substrate 12 and the substrate 43 can prepare.

The present embodiment has the advantages described below.

(1) The plan view shape of each connection pad P2 (plan view shape of the opening 32Y of the solder resist layer 32) is an ellipse having a major axis AX1 lying in the direction extending from the connection pad P2 toward the plan view center B1 of the block 11. Thus, even if displacement occurs between the connection pads P2 and P5 due to the difference in the diagonal size of the block 11 and the diagonal size of the substrate material 60, the connection pads P2 and the connection pads P5 face each other in the vertical direction. Therefore, even if displacement occurs between the connection pads P2 and P5, the solder balls 44 are properly mounted on the connection pads P2, and movement of the solder balls 44 onto the edges of the opening 32Y of the solder resist layer 32 is prevented or reduced. Thus, insufficient solderability that may occur when the solder ball 44 moves onto the solder resist layer 32 is prevented or reduced. Furthermore, the lowering of the connection reliability caused by insufficient solderability is prevented or reduced.

(2) The solder balls 44 are properly mounted on the connection pads P2 even if displacement occurs between the connection pads P2 and P5 due to the difference in the diagonal size of the block 11 and the diagonal size of the substrate material 60. This allows for easy narrowing of the pitch of the connection pads P2 and P5. In other words, even if the diameter of the solder balls 44 decreases as the pitch of the connection pads P2 and P5 narrows, the solder balls 44 may be properly mounted on the connection pads P2 while absorbing the influence of dimensional errors of the block 11 and the substrate material 60.

(3) The plan view shape of each connection pad P2 arranged on the substrates A2 to A9 is formed such that the major axis AX1 of the ellipse becomes longer as the block 11 of the substrate 12 including the connection pad P2 becomes farther from the plan view center B1. Thus, even if the displacement amount between the connection pads P2 and P5 increases in the substrates A2, A4, A7, and A9 located at the corners of the block 11, for example, the solder balls 44 are properly mounted on the connection pads P2 since the major axis AX1 of each connection pad P2 lies long along the direction of displacement.

(4) The plan view shape of each connection pad P2 arranged on the substrates A2 to A9 is formed such that the minor axis AX2 of the ellipse becomes shorter as the block 11 of the substrate 12 including the connection pad P2 becomes farther from the plan view center B1. Thus, even if the major axis AX1 becomes longer as the plan view center B1 becomes farther, the area of the upper surface of each connection pad P2 of the substrate 12 (e.g., substrate A2, A4, A7, or A9) separated from the plan view center B1 remains the same. Therefore, the solder amount in each solder ball 44 neither increases nor decreases.

(5) The upper surfaces of every one of the connection pads P2 in the block 11 are set to have the same area. Thus, the solder balls 44 of the block 11 all have the same solder amount.

Other Embodiments

It should be apparent to those skilled in the art that the present invention may be embodied in many other specific forms without departing from the spirit or scope of the invention. Particularly, it should be understood that the present invention may be embodied in the following forms.

In the embodiment described above, the connection pads P2 of the substrates A2 to A9 located in the peripheral portion of the block 11 are formed to be substantially ellipse in a plan view. Instead, for example, only the connection pads P2 of the substrates A2, A4, A7, and A9 located at the corners of the block 11 may be formed to be substantially ellipse in a plan view. In this case, the connection pads P2 arranged in the remaining substrates A1, A3, A5, A6, and A8 are formed to be a substantially true circle in a plan view. For example, all the connection pads P2 arranged in the block 11 may be formed to be substantially ellipse in a plan view.

In the embodiment described above, the predetermined array of the substrates 12 forming the block 11 is a matrix array. Instead, for example, the block 11 may be formed by substrates 12 laid out in strips. In other words, the array of the substrates 12 is not particularly limited as long as the wiring substrate includes the block 11 in which N×M (N is an integer greater than or equal to two, M is an integer greater than or equal to one) substrates 12 are laid out in a predetermined array.

For example, in the embodiment described above, the plan view center B1 of the block 11 coincides with the plan view center of the substrate A1 located at the center of the block 11. However, the plan view center B1 of the block 11 may not coincide with the plan view center of the substrate A1 arranged at the central part of the block 11 depending on the array of the substrate 12. In the embodiment described above, the number of non-peripheral portion substrate 12 (A1) that does not form the peripheral portion of the block 11 is one. However, the number of non-peripheral portion substrates 12 (A1) may be two or more depending on the array of the substrate 12.

Figure 15:
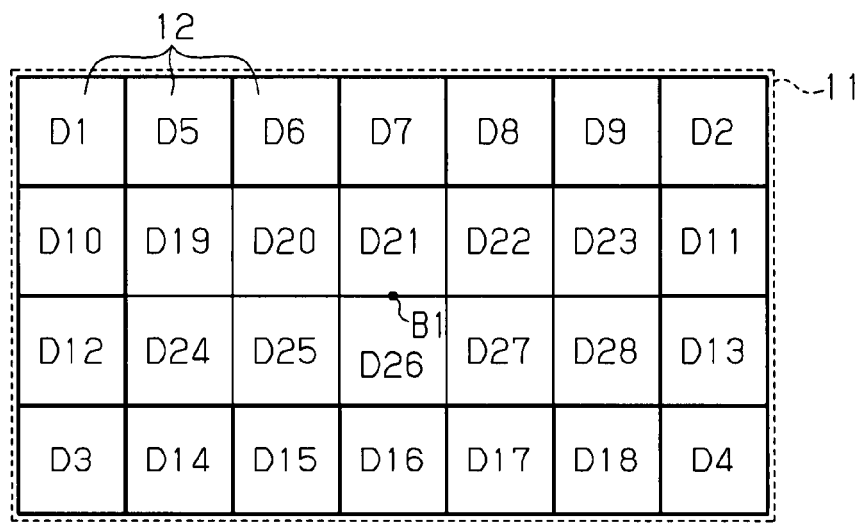
FIG. 15 is a schematic plan view showing a modified example of the wiring substrate.

For example, as shown in FIG. 15, the block 11 may include the substrates 12 in a 7×4 matrix. In this example, only the connection pads P2 of the substrates 12 (corner substrates D1 to D4 of FIG. 15) located at the corners of the block 11 are substantially ellipse in a plan view. In this case, the connection pads P2 of the remaining substrates 12 (non-corner substrates D5 to D28 of FIG. 15) are substantially true circle in a plan view. Only the connection pads P2 of the substrates 12 (peripheral portion substrates D1 to D18 of FIG. 15) located at the peripheral portion of the block 11 are substantially ellipse in a plan view. In this case, the connection pads P2 arranged on the remaining substrates 12 (non-peripheral portion substrates D19 to D28 of FIG. 15) are substantially true circle in a plan view. All the connection pads P2 arranged in the block 11 may be substantially ellipse in a plan view. In any case, each connection pad P2 having a substantially elliptical shape in a plan view has a major axis AX1 lying in the direction extending from the connection pad P2 toward the plan view center B1 of the block 11 (or direction from the substrate 12 including the connection pad P2 toward the plan view center B1).

In the embodiment, each connection pad P2 is formed to be substantially ellipse in a plan view. Instead, for example, each connection pad P5 may be formed to be substantially ellipse in a plan view. In this case, for example, the solder balls 44 are first joined with the connection pads P2, and then the solder balls 44 are joined with the connection pads P5 that are substantially ellipse in a plan view.

The connection pad P2 is not limited to the substantially elliptical shape in a plan view as long as it has an elongated shape, and for example, may be changed to an elongated or non-square rectangular shape, or an oval or an elongated circle.

Figure 16:
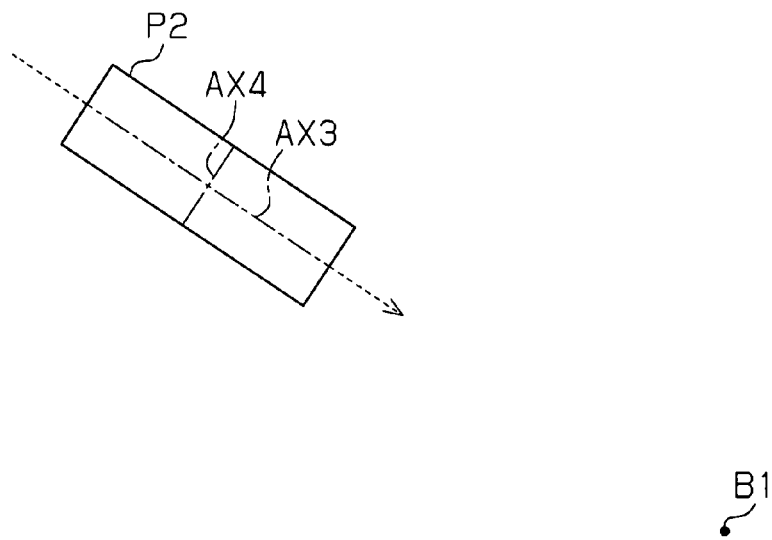
FIG. 16 is a schematic plan view showing a modified example of a connection pad.
Figure 17:
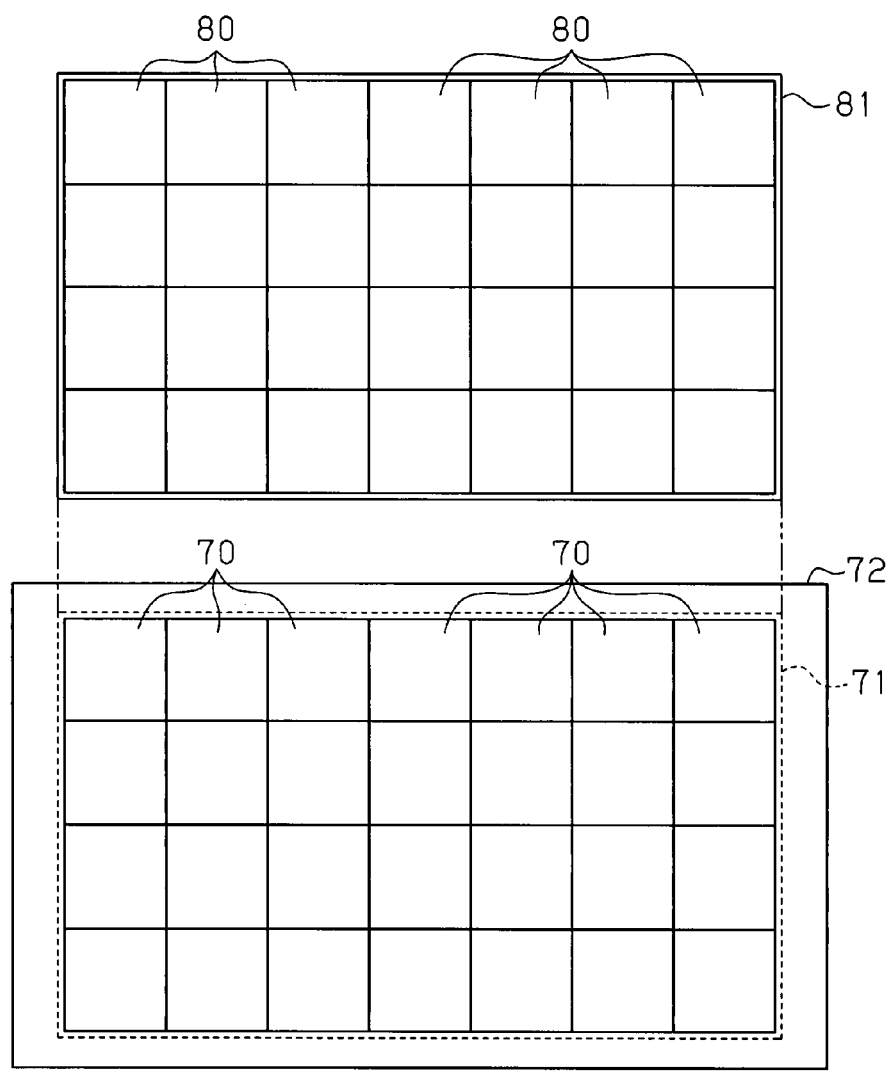
FIG. 17 is a schematic plan view illustrating a conventional method for manufacturing a semiconductor package.

For example, as shown in FIG. 16, if the plan view shape of each connection pad P2 is an elongated or non-square rectangular shape, a first axis AX3 lies in the direction (see broken line arrow) from the connection pad P2 toward the plan view center B1 of the block 11, and the length (long side) along the first axis AX3 is longer than the length (short side) along a second axis AX4, which is orthogonal to the first axis AX3.

Thus, the plan view shape of the connection pad P2 can be changed as long as it is a plan view shape in which the first axis AX3 lies along the direction from the connection pad P2 toward the plan view center B1 of the block 11 and the length along the first axis AX3 is formed to be longer than the length along the second axis AX4, which is orthogonal to the first axis AX3. The plan view shape of each connection pad P2 may be a shape in which the first axis AX3 lies along the direction from the substrate 12 including the connection pad P2 toward the plan view center B1 and the length along the first axis AX3 is longer than the length along the second axis AX4.

In the embodiment, the upper surfaces of all the connection pads P2 arranged in the block 11 are set to have the same area. However, the upper surfaces of the connection pads P2 in the block 11 may have different areas.

In the embodiment, the length of the major axis AX1 (first axis AX3) of the connection pad P2 and the length of the minor axis AX2 (second axis AX4) are both changed according to the positional relationship relative to the plan view center B1 of the block 11. Instead, for example, only the length of the major axis AX1 (first axis AX3) of the connection pad P2 may be changed in accordance with the positional relationship relative to the plan view center B1 of the block 11. In this case, for example, the length of the major axis AX1 (first axis AX3) of each connection pad P2 may be increased as the substrate 12 including the connection pad P2 becomes farther from the plan view center B1, and the length of the minor axis AX2 (second axis AX4) of the connection pad P2 may be fixed.

In the substrate 12 of the embodiment, the structure of the inner layer from the wiring patterns 30 and 33 of the outermost layer is not particularly limited. In other words, the substrate 12 merely needs to have a structure in which the wiring patterns 30 and 33 of the outermost layer are electrically connected to each other through the substrate interior, and hence the structure of the inner layer from the wiring patterns 30 and 33 of the outermost layer is not particularly limited. For example, the structure and the material of the core substrate 21 are not particularly limited. The number of lower layer wirings (e.g., wires 25, 26) and the insulating layers (e.g., insulating layers 23, 24) that cover such lower layer wirings formed on the core substrate 21 is also not particularly limited. Alternatively, the substrate body 20 may be a coreless substrate without the core substrate 21, in place of the build-up substrate with a core including the core substrate 21.

In the substrate 43 of the embodiment, the structure of the inner layer from the wiring patterns 53 and 56 of the outermost layer is not particularly limited. In other words, the substrate 43 merely needs to have a structure in which the wiring patterns 53 and 56 of the outermost layer are electrically connected to each other through the substrate interior, and hence the structure of the inner layer from the wiring patterns 53 and 56 of the outermost layer is not particularly limited. For example, the structure and the material of the core substrate 51 are not particularly limited. The lower layer wirings and the insulating layers that cover such lower layer wirings may be formed to a required number of layers on the core substrate 51. Alternatively, the substrate 43 may be a coreless substrate that does not include the core substrate 51.

In the embodiment, the copper core ball 44A is used as a conductive core ball of the solder ball 44. Instead, a conductive core ball made from a metal other than copper, such as gold or nickel, may be used or a resin core ball made from resin may be used, for example, in place of the copper core ball 44A. Alternatively, a solder ball in which the conductive core ball or the resin core ball is omitted may be used in place of the solder ball 44.

In the semiconductor package 40 of the embodiment, a plurality of electronic components may be mounted on the substrate 12.

The encapsulation resin 45 in the embodiment may be omitted.

In the embodiment, the semiconductor package 40 having a structure in which two substrates 12 and 43 are stacked upon each other by way of the solder balls 44. Instead, for example, a semiconductor package may have a structure in which three or more substrates are stacked upon one another by way of the solder balls 44.

The present examples and embodiments are to be considered as illustrative and not restrictive, and the invention is not to be limited to the details given herein, but may be modified within the scope and equivalence of the appended claims.

The invention claimed is:

1. A wiring substrate comprising:
a block including a plurality of first substrates laid out in a predetermined array, wherein the block includes a plurality of corners and a plan view center, wherein
each of the plurality of first substrates is adapted to be fixedly connected to an electronic component and a second substrate to manufacture a semiconductor package and includes
an electronic component mounting region where the electronic component is mounted,
a substrate body,
a plurality of connection pads formed on an upper surface of the substrate body and surrounding the periphery of the electronic component mounting region, wherein each of the connection pads includes a pad surface, and
a solder resist layer including a plurality of openings corresponding to the plurality of connection pads, wherein the pad surface of each connection pad is recessed in the corresponding opening to form a recess for receiving a solder ball that fixedly connects the first substrate to the second substrate,
the connection pads of the first substrates include first pads, which are the pads of one of the first substrates located in at least one of the corners of the block,
the pad surface of each of the first pads includes a first axis extending from the first pad toward the plan view center of the block, and
the pad surface of each of the first pads has a first length along the corresponding first axis and a second length along a second axis, which is orthogonal to the first axis, and the first length is longer than the second length.

2. The wiring substrate according to claim 1, wherein the first pads are the pads of ones of the first substrates located in at least a peripheral portion of the block.

3. The wiring substrate according to claim 1, wherein the pad surfaces of the first pads are each formed so that the first axis is longer and the second axis is shorter when the corresponding first substrate is farther from the plan view center of the block.

4. The wiring substrate according to claim 1, wherein the pad surfaces of the first pads are each formed so that the first axis is longer and the second axis is shorter when the first pad is farther from the plan view center of the block.

5. The wiring substrate according to claim 1, wherein the pad surfaces of the connection pads in the block have the same area.

6. The wiring substrate according to claim 1, wherein the pad surface of each of the first pads has an elliptical shape including a major axis, which is the first axis, and a minor axis, which is the second axis.

7. The wiring substrate according to claim 1, wherein the plurality of openings of the solder resist layer are arranged outside the electronic component mounting region, and each of the plurality of openings of the solder resist layer is an ellipse opening having a major axis and a minor axis, the ellipse opening having the first length in the major axis that is the first axis and the second length in the minor axis that is the second axis.

8. A wiring substrate comprising:
a block including a plurality of first substrates laid out in a predetermined array, wherein the block includes a plurality of corners and a plan view center, wherein
each of the plurality of first substrates is adapted to be fixedly connected to an electronic component and a second substrate to manufacture a semiconductor package and includes
an electronic component mounting region where the electronic component is mounted,
a substrate body, and
a plurality of connection pads formed on an upper surface of the substrate body and surrounding the periphery of the electronic component mounting region, wherein each of the connection pads includes a pad surface, and
a solder resist layer including a plurality of openings corresponding to the plurality of connection pads, wherein the pad surface of each connection pad is recessed in the corresponding opening to form a recess for receiving a solder ball that fixedly connection the first substrate to the second substrate,
the connection pads of the first substrates include first pads, which are the pads of one of the first substrates located in at least one of the corners of the block,
the pad surface of each of the first pads includes a first axis extending from the first substrate including the first pad toward the plan view center of the block, and
the pad surface of each of the first pads has a first length along the corresponding first axis and a second length along a second axis, which is orthogonal to the first axis, and the first length is longer than the second length.

9. The wiring substrate according to claim 8, wherein the first pads are the pads of ones of the first substrates located in at least a peripheral portion of the block.

10. The wiring substrate according to claim 8, wherein the pad surfaces of the first pads are each formed so that the first axis is longer and the second axis is shorter when the corresponding first substrate is farther from the plan view center of the block.

11. The wiring substrate according to claim 8, wherein the pad surfaces of the first pads are each formed so that the first axis is longer and the second axis is shorter when the first pad is farther from the plan view center of the block.

12. The wiring substrate according to claim 8, wherein the pad surfaces of the connection pads in the block have the same area.

13. The wiring substrate according to claim 8, wherein the pad surface of each of the first pads has an elliptical shape including a major axis, which is the first axis, and a minor axis, which is the second axis.

14. The wiring substrate according to claim 8, wherein the plurality of openings of the solder resist layer are arranged outside the electronic component mounting region, and each of the plurality of openings of the solder resist layer is an ellipse opening having a major axis and a minor axis, the ellipse opening having the first length in the major axis that is the first axis and the second length in the minor axis that is the second axis.

15. A semiconductor package comprising:
an electronic component;
a first substrate including an electronic component mounting region where the electronic component is mounted, first connection pads surrounding the periphery of the electronic component mounting region, and a solder resist layer having a plurality of openings corresponding to the first connection pads;
a second substrate including second connection pads and a solder resist layer having a plurality of openings corresponding to the second connection pads; and
solder balls arranged between the first substrate and the second substrate and joined with the first connection pads and the second connection pads to fixedly connect the first substrate to the second substrate,
wherein
either one of the first connection pads and the second connection pads serve as substrate pads, each including a pad surface having a first axis lying along a direction extending from the substrate pad toward an arbitrary point, and the pad surface of each of the substrate pads has a first length along the corresponding first axis and a second length along a second axis orthogonal to the first axis, and the first length is greater than the second length, and the pad surface of each of the substrate pads is recessed in the corresponding opening of the solder resist layer to form a recess for receiving the corresponding solder ball.

16. The semiconductor package according to claim 15, wherein the arbitrary point and the substrate pads are located on a same plane, and the arbitrary point is located outside the semiconductor package.

17. The semiconductor package according to claim 15, wherein the plurality of openings of the solder resist layer are arranged outside the electronic component mounting region, and each of the plurality of openings of the solder resist layer is an ellipse opening having a major axis and a minor axis, the ellipse opening having the first length in the major axis that is the first axis and the second length in the minor axis that is the second axis.

18. A method for manufacturing a semiconductor package, the method comprising:
forming a wiring substrate that includes a block including an N×M number of (N is an integer that is greater than or equal to two, M is an integer greater than or equal to one) first substrates and a plan view center, wherein each of the first substrates includes an electronic component mounting region where an electronic component is mounted first connection pads surrounding the periphery of the electronic component mounting region, and a solder resist layer having a plurality of openings corresponding to the first connection pads;
mounting an electronic component on the electronic component mounting region of each of the first substrates;
forming a substrate material including an N×M number of second substrates, wherein each of the second substrates includes second connection pads;
joining solder balls with the second connection pads;
joining the solder balls with the first connection pads to fix the substrate material to the wiring substrate with the solder balls; and
cutting a set of the wiring substrate and the substrate material at predetermined locations to singulate the semiconductor package including the electronic component, the first substrate, and the second substrate; wherein
the first connection pads of one of the N×M first substrates located in at least one corner of the of the block includes a pad surface having a first axis extending from the first connection pad to a plan view center of the block, and
the pad surface of the each of the first connection pads has a first length extending along the first axis and a second length extending along a second axis, which is orthogonal to the first axis, and the first length is greater than the second length and the pad surface of each of the first connection pads is recessed in the corresponding opening of the solder resist layer to form a recess for receiving the corresponding solder ball.

19. The method according to claim 18, wherein the plurality of openings of the solder resist layer are arranged outside the electronic component mounting region, and each of the plurality of openings of the solder resist layer is an ellipse opening having a major axis and a minor axis, the ellipse opening having the first length in the major axis that is the first axis and the second length in the minor axis that is the second axis.

* * * * *

UNITED STATES PATENT AND TRADEMARK OFFICE
CERTIFICATE OF CORRECTION

PATENT NO. : 9,524,931 B2
APPLICATION NO. : 14/592105
DATED : December 20, 2016
INVENTOR(S) : Shiraki It is certified that error appears in the above-identified patent and that said Letters Patent is hereby corrected as shown below:

In the Claims

Column 18, Line 11, Claim 8, after "body," delete "and".

Column 18, Line 22, Claim 8, delete "connection" and insert -- connects --, therefor.

Column 20, Line 2, Claim 18, after "mounted" insert -- , --.

Column 20, Line 21, Claim 18, delete "of the of the" and insert -- of the --, therefor.

Column 20, Line 29, Claim 18, after "length" insert -- , --.

Signed and Sealed this
Seventh Day of March, 2017

Michelle K. Lee
*Director of the United States Patent and Trademark Office*